US012652844B2

(12) United States Patent
Ayano et al.

(10) Patent No.: US 12,652,844 B2
(45) Date of Patent: Jun. 9, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Tomoki Ayano, Tokyo (JP); Takahiro Maruyama, Tokyo (JP); Yuya Abiko, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 449 days.

(21) Appl. No.: 18/322,989

(22) Filed: May 24, 2023

(65) Prior Publication Data

US 2024/0079458 A1 Mar. 7, 2024

(30) Foreign Application Priority Data

Sep. 2, 2022 (JP) ................................. 2022-139774

(51) Int. Cl.
| | |
|---|---|
| *H10D 64/01* | (2025.01) |
| *H10D 30/01* | (2025.01) |
| *H10D 30/66* | (2025.01) |
| *H10D 64/00* | (2025.01) |

(52) U.S. Cl.
CPC ......... *H10D 64/01* (2025.01); *H10D 30/0297* (2025.01); *H10D 30/668* (2025.01); *H10D 64/117* (2025.01)

(58) Field of Classification Search
CPC .................................................... H10D 64/01
See application file for complete search history.

(56) References Cited

U.S. PATENT DOCUMENTS

| | | |
|---|---|---|
| 10,361,276 B1 | 7/2019 | Seok |
| 2006/0166419 A1 | 7/2006 | Shimoyama et al. |
| 2009/0072305 A1 | 3/2009 | Nakao |
| 2012/0241849 A1 | 9/2012 | Nozu |

(Continued)

FOREIGN PATENT DOCUMENTS

| | | |
|---|---|---|
| JP | 2003-209252 A | 7/2003 |
| JP | 2009-071097 A | 4/2009 |

(Continued)

OTHER PUBLICATIONS

Office Action issued on Aug. 6, 2025 in the corresponding German patent application No. 10 2023 123 573.7, w/ English Translation.

(Continued)

*Primary Examiner* — Fernando L Toledo
*Assistant Examiner* — Shawn Shaw Muslim
(74) *Attorney, Agent, or Firm* — Rimon P.C.

(57) ABSTRACT

A trench is formed in a semiconductor substrate. An insulating film is formed in the trench and on an upper surface of the semiconductor substrate. An ion implantation is performed to the insulating film. An etching treatment is performed to the insulating film, thereby a thickness of the insulating film is reduced. A conductive film is formed in the trench via the insulating film. In plan view, the trench extends in a Y-direction. The above-described ion implantation is performed from a direction inclined by a predetermined angle from an extending direction of a normal line with respect to the upper surface of the semiconductor substrate.

14 Claims, 27 Drawing Sheets

(56)            References Cited

U.S. PATENT DOCUMENTS

| | | | |
|---|---|---|---|
| 2016/0079375 A1 | 3/2016 | Yamazaki | |
| 2016/0093719 A1 | 3/2016 | Kobayashi et al. | |
| 2016/0329423 A1 | 11/2016 | Kawahara et al. | |
| 2019/0097041 A1 | 3/2019 | Ohtani | |
| 2020/0006127 A1* | 1/2020 | Khaderbad | H01L 21/76895 |
| 2022/0085160 A1* | 3/2022 | Nishiwaki | H10D 30/0297 |

FOREIGN PATENT DOCUMENTS

| | | |
|---|---|---|
| JP | 2011-199109 A | 10/2011 |
| JP | 2019-195045 A | 11/2019 |
| WO | 2017/168733 A1 | 10/2017 |

OTHER PUBLICATIONS

Office Action dated Oct. 7, 2025, issued in corresponding Japan Application No. 2022-139774, 14 pages.

* cited by examiner

*FIG. 9*

B-B CROSS SECTION

A-A CROSS SECTION

B-B CROSS SECTION

A-A CROSS SECTION

F/G. 13

<STUDIED EXAMPLE>

*FIG. 26*
<STUDIED EXAMPLE>

<STUDIED EXAMPLE>

SEMICONDUCTOR DEVICE AND METHOD OF MANUFACTURING THE SAME

CROSS-REFERENCE TO RELATED APPLICATIONS

The disclosure of Japanese Patent Application No. 2022-139774 filed on Sep. 2, 2022 including the specification, drawings and abstract is incorporated herein by reference in its entirety.

BACKGROUND

The present invention relates to a semiconductor device and a method of manufacturing the same, and particularly relates to a semiconductor device including a gate electrode and a field plate electrode in a trench and a method of manufacturing the same.

In a semiconductor device including a semiconductor element such as a power MOSFET (Metal Oxide Semiconductor Field Effect Transistor), a trench gate structure in which a gate electrode is embedded in a trench is applied. As a type of the trench gate structure, there is a split gate structure in which a field plate electrode is formed at a lower portion of a trench and a gate electrode is formed at an upper portion of the trench. The field plate electrode is electrically connected to a source electrode. A depletion layer is expanded in a drift region by this field plate electrode, so that it becomes possible to increase a concentration in the drift region, and it becomes possible to reduce a resistance of the drift region.

There is disclosed a technique listed below.

[Patent Document 1] Japanese Unexamined Patent Application Publication No. 2011-199109

For example, Patent Document 1 discloses a semiconductor device to which a split gate structure having a gate electrode and a field plate electrode is applied.

SUMMARY

In accordance with the studies by the inventors of this application, it has been found out that, at the time of depositing a conductive film to be a base of the field plate electrode, a void called a seam is likely to occur in the conductive film, and this void causes a variety of problems. FIG. 25 to FIG. 27 show a semiconductor device in a studied example that the inventors of this application studied, and show states before and after the manufacturing step of forming a field plate electrode. With reference to FIG. 25 to FIG. 27, problems which occur in the studied example will be described below. The studied example and the problems thereof are not the findings known heretofore but the findings newly found by the inventors of this application.

As shown in FIG. 25, in the split gate structure, first, a trench TR1 is formed in a semiconductor substrate SUB. Next, an insulating film IF1 for insulating the semiconductor substrate SUB and the field plate electrode is formed in the trench TR1. The insulating film IF1 is a silicon oxide film formed by the CVD (Chemical Vapor Deposition) method.

When the insulating film IF1 is formed by the CVD method, a thickness of the insulating film IF1 tends to be large at an uppermost portion (opening) of the trench TR1, and the insulating film IF1 is likely to overhang. For example, a thickness T4 of the insulating film IF1 at a position of an upper surface of the semiconductor substrate SUB is larger than a thickness T3 of the insulating film IF1 at half the depth from the upper surface of the semiconductor substrate SUB to the deepest portion of the trench TR1. The "thickness" mentioned herein is a thickness based on a side surface (inner wall surface) of the trench TR1 rather than a thickness based on a bottom surface of the trench TR1.

As shown in FIG. 26, the conductive film CF1 for the field plate electrode is deposited in the trench TR1 by the CVD method. The conductive film CF1 is, for example, an n-type polycrystalline silicon film. Herein, if the insulating film IF1 overhangs, filling failure of the conductive film CF1 is likely to occur. That is, a void 20 is likely to occur in the conductive film CF1.

FIG. 27 shows a state in which the conductive film CF1 is processed to form a field plate electrode FP when the void 20 is present. First, the conductive film CF1 formed outside the trench TR1 is removed, and thereafter, the conductive film CF1 is retreated by an etching treatment, so that the field plate electrode FP is formed. Next, by the wet etching treatment, the insulating film IF1 formed outside the trench TR1 is removed, and the insulating film IF1 in the trench TR1 is retreated. Next, by a thermal oxidation method, a gate insulating film GI is formed in the trench TR1 on the insulating film IF1, and an insulating film IF2 is formed on a surface of the field plate electrode FP exposed from the insulating film IF1.

Herein, the etching treatment is performed to the conductive film CF1 in a state in which the void 20 is present, and therefore, a shape of an upper portion of the field plate electrode FP is likely to be abnormal. Moreover, the insulating film IF2 is going to be formed along the void 20. Then, a volume expands inside the field plate electrode FP, and a stress is applied from the insulating film IF2 to the outside of the trench TR1. In particular, the stress is likely to be applied in the vicinities of corner portions of the trench TR1. Therefore, crystal defects 30 are likely to occur in the semiconductor substrate SUB located in the vicinities of the corner portions of the trench TR1. When a large number of the crystal defects 30 occur, these become a leakage path, causing a decrease in withstand voltage of the MOSFET.

Moreover, after the manufacturing step in FIG. 27, a gate electrode is formed on the field plate electrode FP via the insulating film IF2. When the void 20 is present, the upper portion of the field plate electrode FP is likely to be processed like a protruding portion. An electric field is likely to be concentrated at such a protruding portion, and therefore, insulation resistance between the field plate electrode FP and the gate electrode becomes likely to be degraded.

A main object of this application is to solve the problems of the studied example and enhance reliability of the semiconductor device by suppressing the occurrence of the void 20. Other objects and novel features will be apparent from the description in this specification and the accompanying drawings.

Outlines of representative embodiments disclosed in this application will be briefly described below.

A method of manufacturing a semiconductor device according to one embodiment includes: (a) preparing a semiconductor substrate of a first conductivity type, the semiconductor substrate having an upper surface and a lower surface; (b) forming a first trench in the upper surface of the semiconductor substrate; (c) forming a first insulating film in the first trench and on the upper surface of the semiconductor substrate; (d) performing a first ion implantation to the first insulating film; (e) after the (d), reducing a thickness of the first insulating film by performing an etching treatment to the first insulating film; and (f) after the (e), forming a first conductive film in the first trench via the first insulating film. Herein, in plan view, the first trench extends in a first direction, and in the (d), the first ion implantation is performed from a direction inclined by a first angle from a normal direction with respect to the upper surface of the semiconductor substrate in cross-sectional view.

A semiconductor device according to one embodiment includes: a semiconductor substrate having an upper surface and a lower surface; a first trench formed in the upper surface of the semiconductor substrate so as to extend in a first direction in plan view; a field plate electrode formed inside the first trench at a lower portion of the first trench; and a gate electrode that is formed inside the first trench at an upper portion of the first trench and is electrically insulated from the field plate electrode. Herein, a part of the field plate electrode is formed not only at the lower portion of the first trench but also at the upper portion of the first trench, and composes a contact portion of the field plate electrode. Also, in cross-sectional view, a width of the contact portion at a position of the upper surface of the semiconductor substrate is larger than a width of the contact portion at half a depth from the upper surface of the semiconductor substrate to a deepest portion of the first trench.

According to one embodiment, the reliability of the semiconductor device can be enhanced.

BRIEF DESCRIPTION OF THE DRAWINGS

FIG. 9 is a cross-sectional view showing a manufacturing step subsequent to FIG. 8.

4

Figure 19:
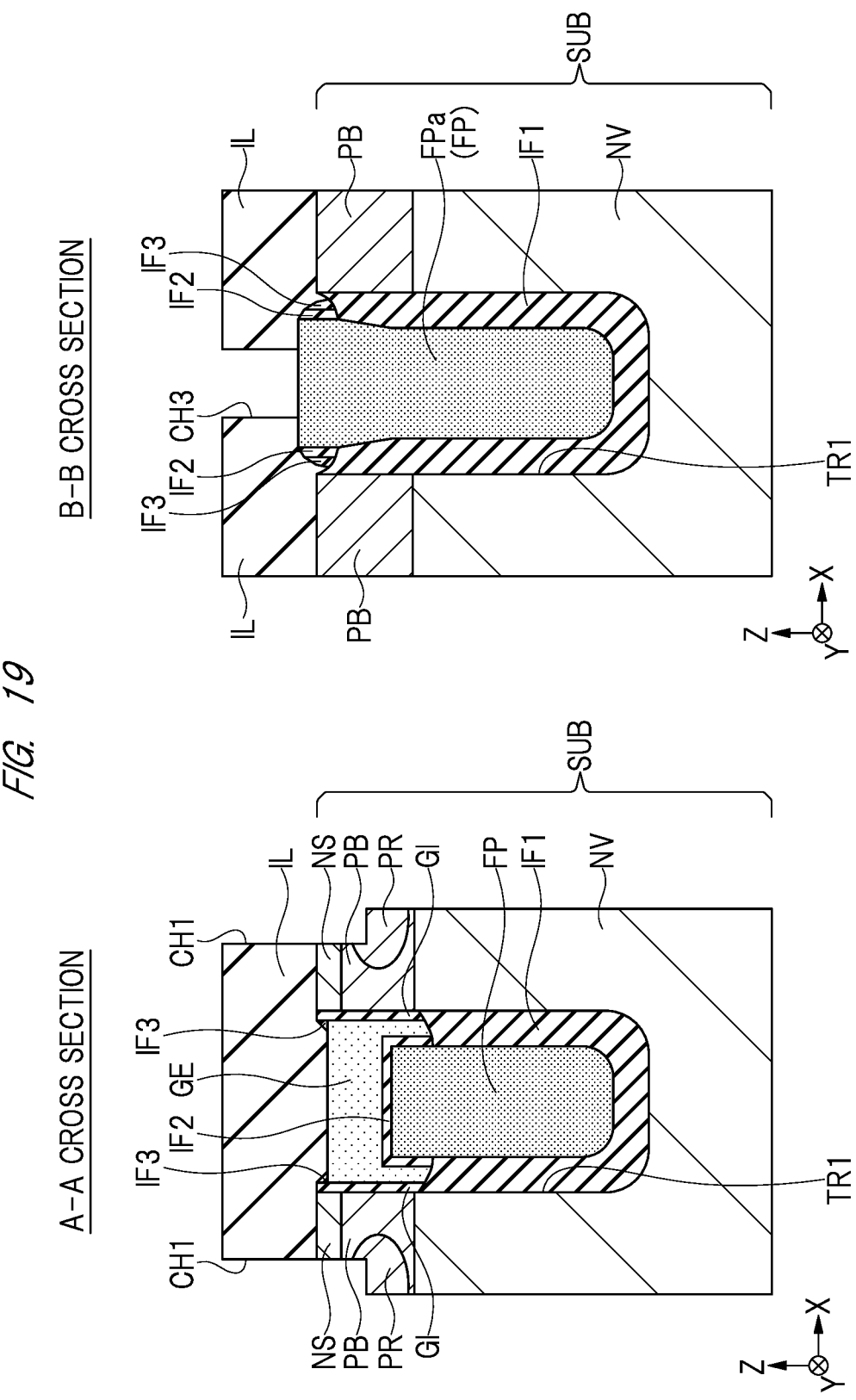
FIG. 19 is a cross-sectional view showing a manufacturing step subsequent to FIG. 18.
Figure 20:
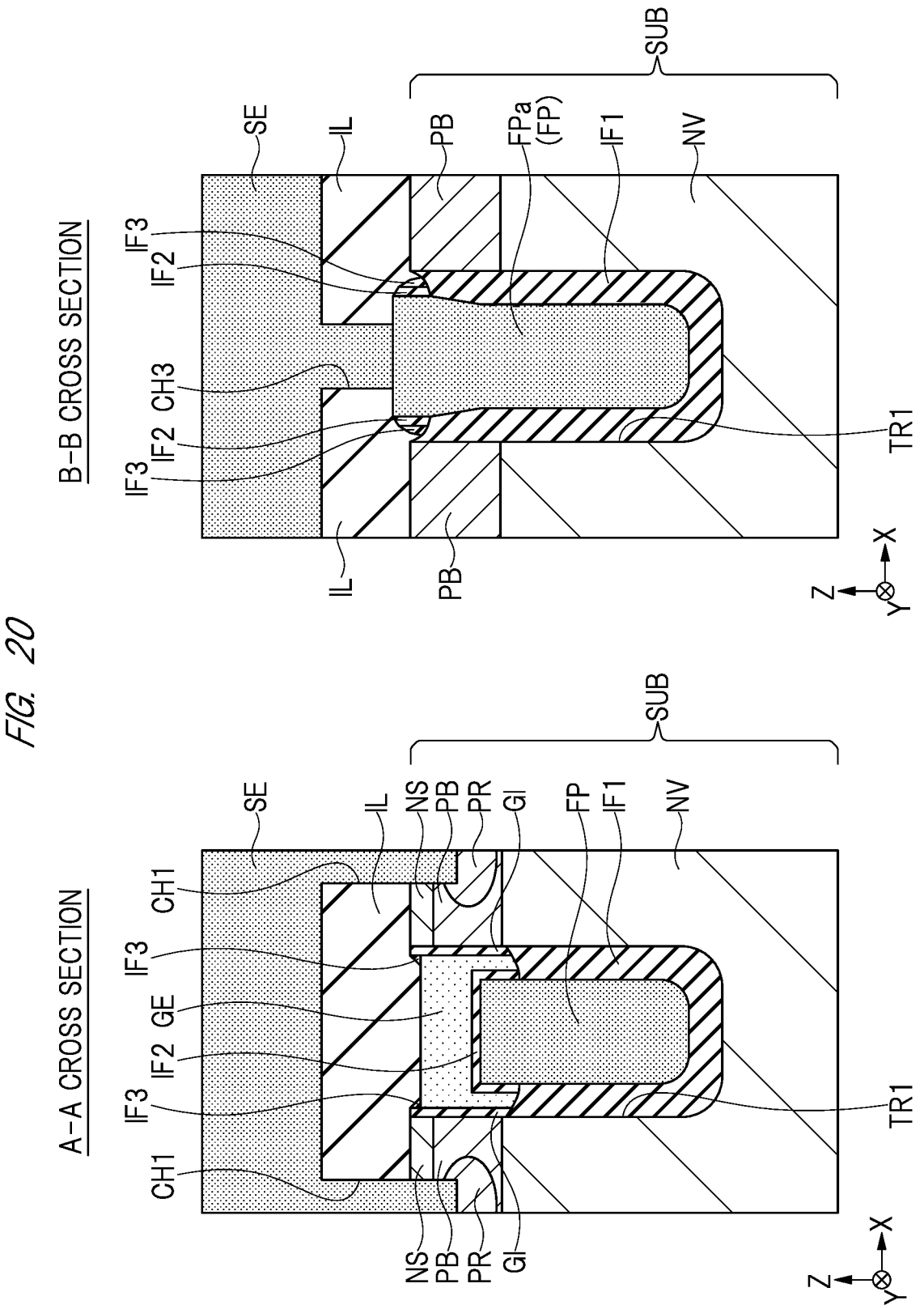

FIG. 20 is a cross-sectional view showing a manufacturing step subsequent to FIG. 19.

Figure 21:
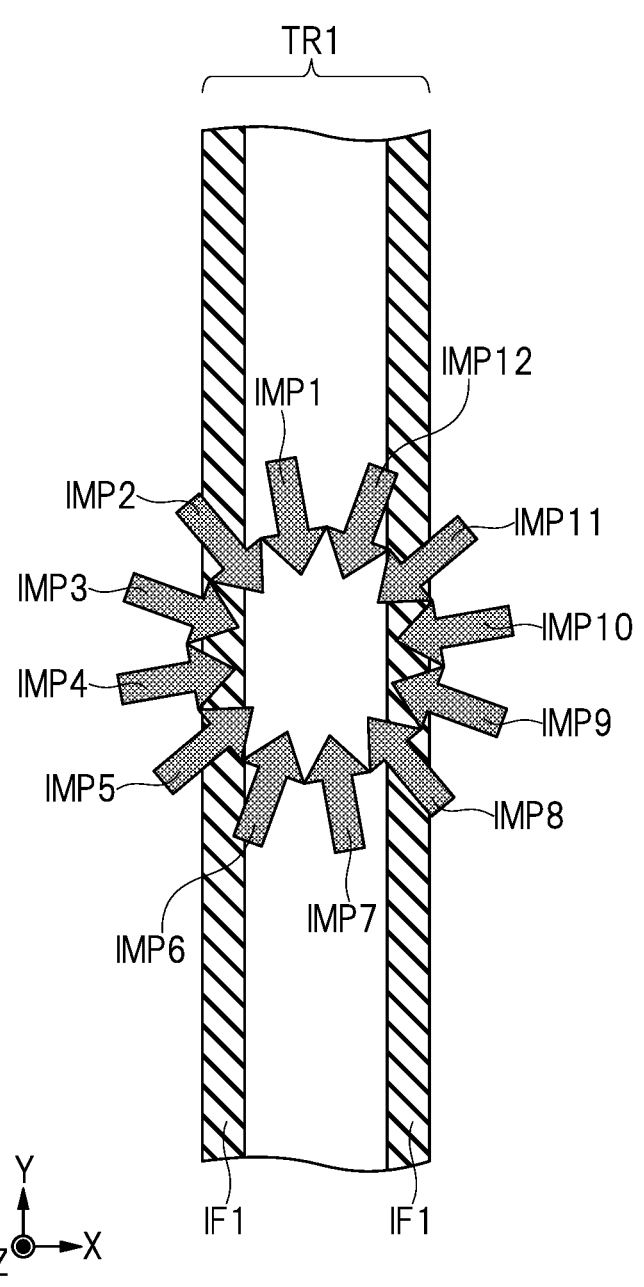

FIG. 21 is an enlarged plan view showing a manufacturing step of a semiconductor device in a second embodiment.

Figure 22:
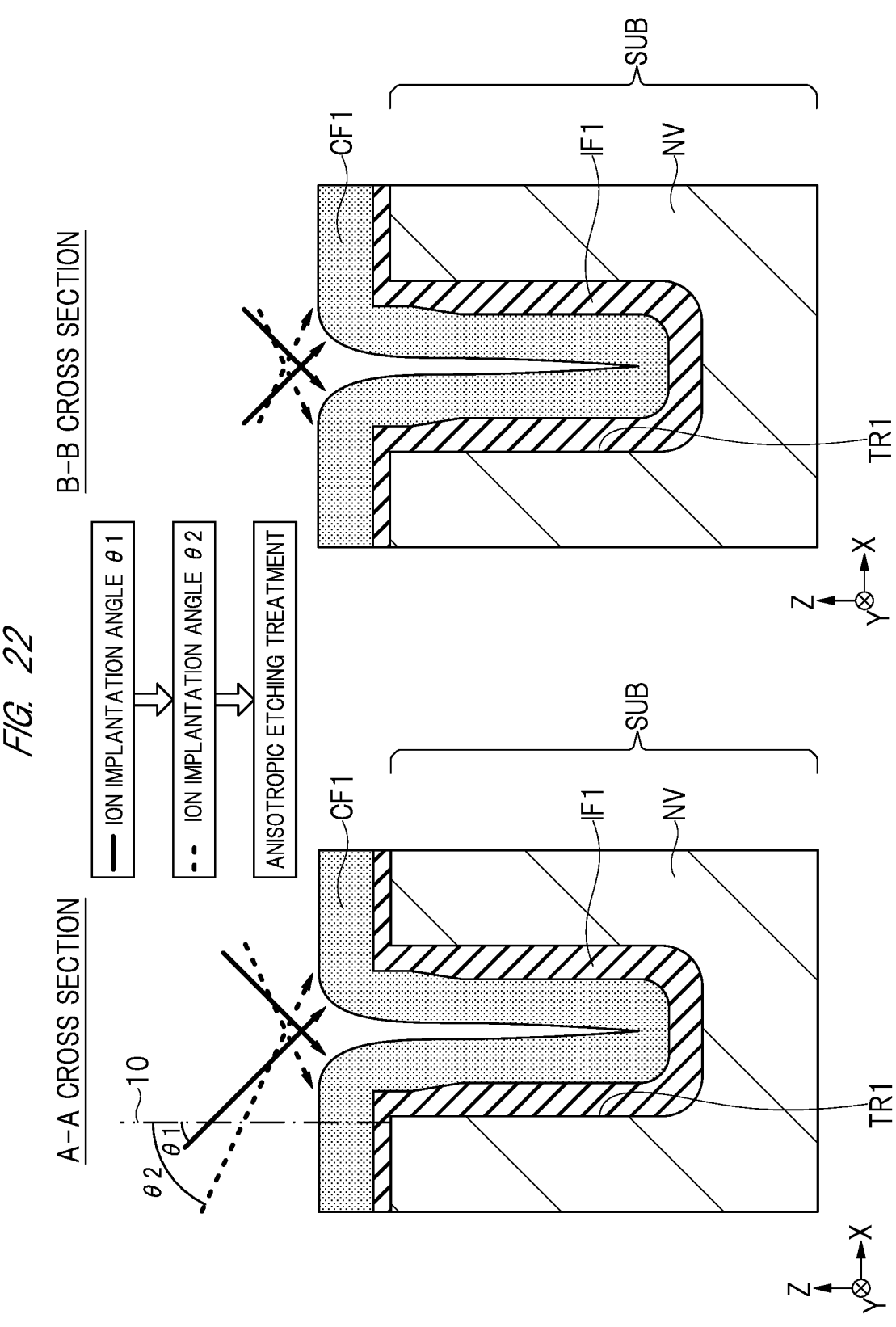

FIG. 22 is a cross-sectional view showing a manufacturing step of a semiconductor device in a third embodiment.

Figure 23:
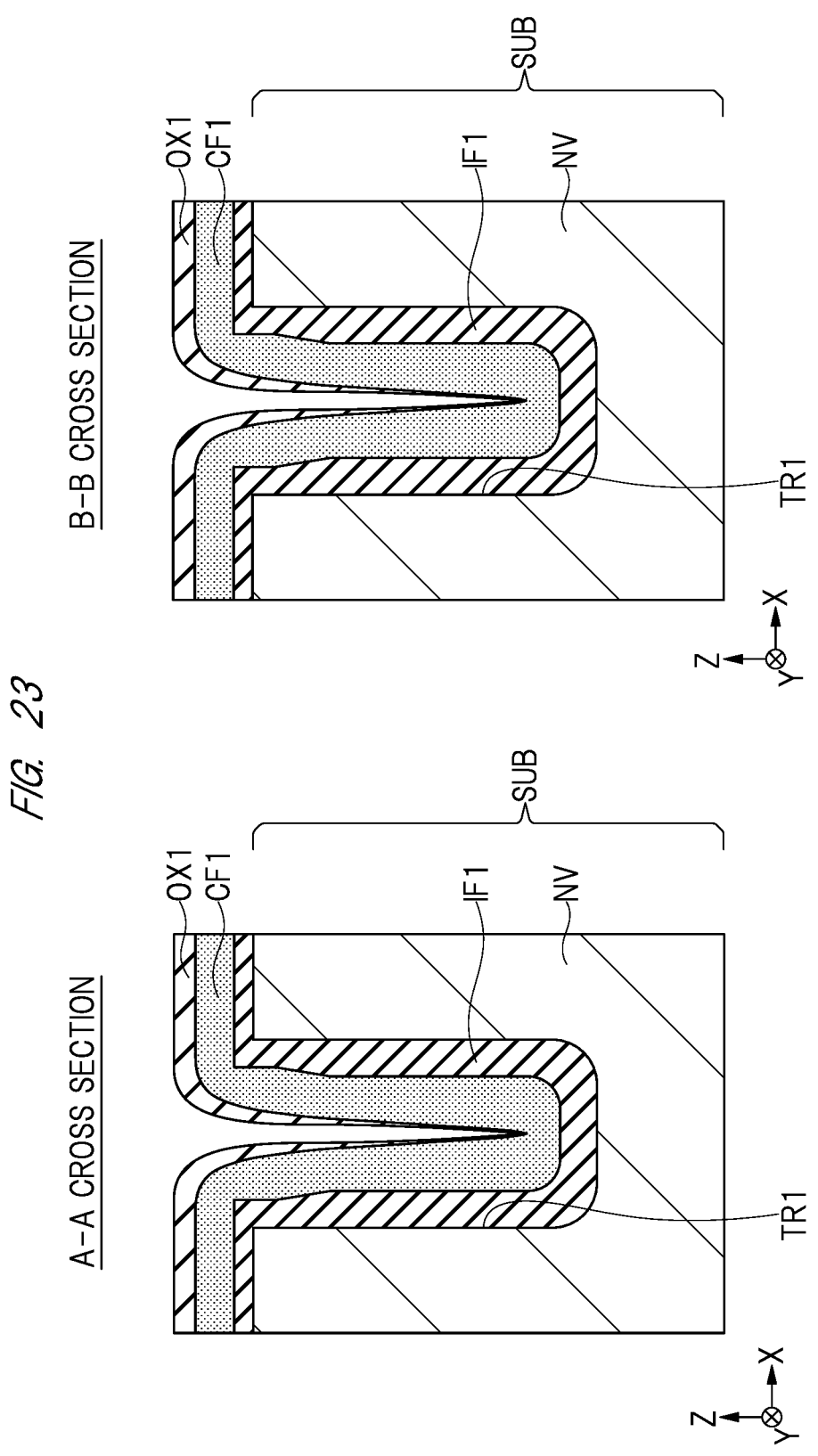

FIG. 23 is a cross-sectional view showing a manufacturing step of a semiconductor device in a modification.

Figure 24:
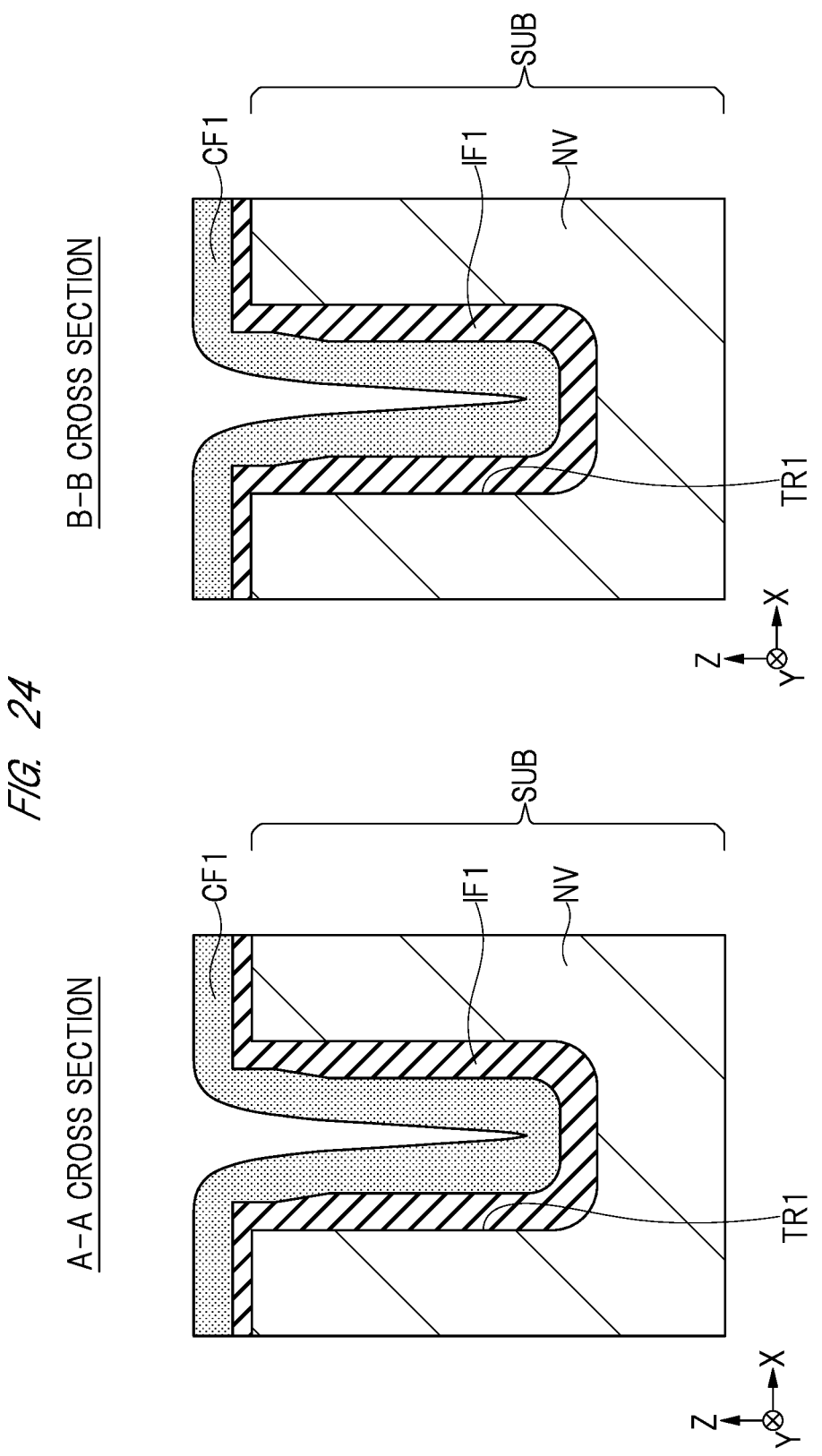

FIG. 24 is a cross-sectional view showing a manufacturing step subsequent to FIG. 23.

Figure 25:
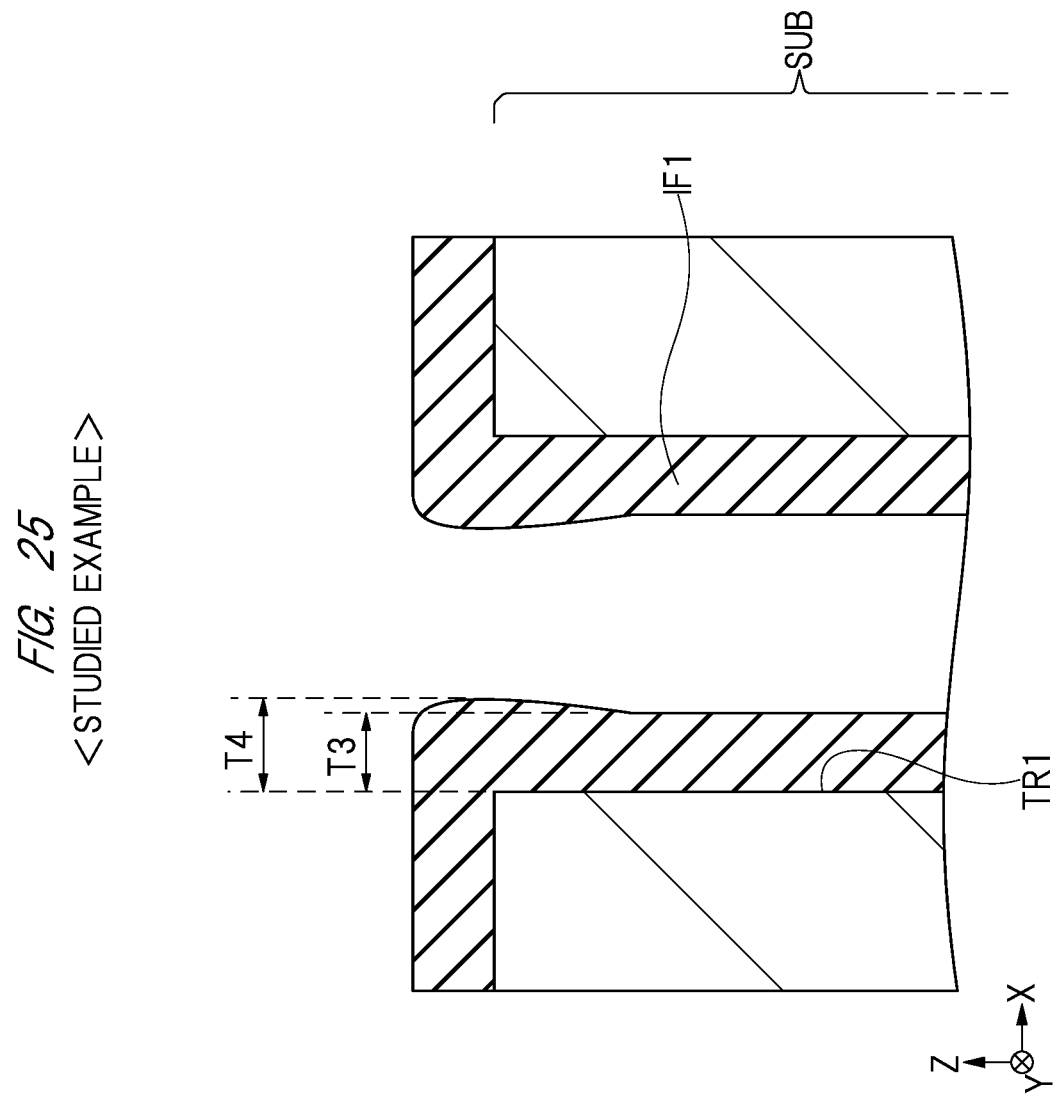

FIG. 25 is a cross-sectional view showing a manufacturing step of a semiconductor device in a studied example.

Figure 26:
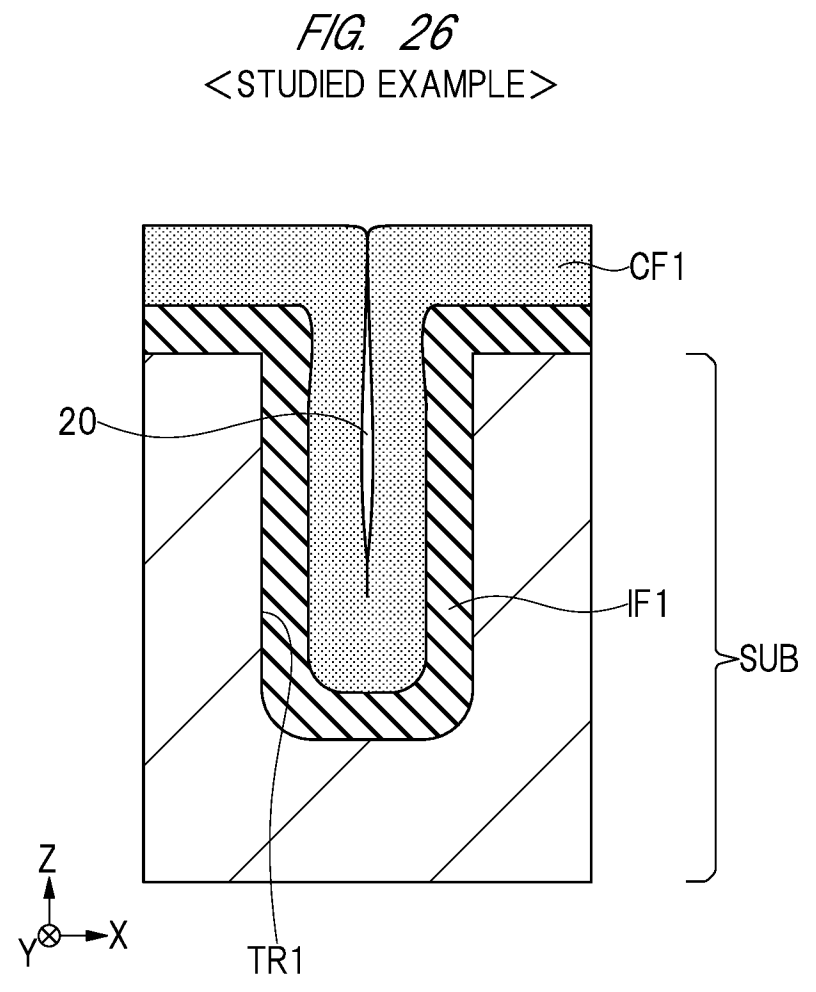

FIG. 26 is a cross-sectional view showing a manufacturing step subsequent to FIG. 25.

Figure 27:
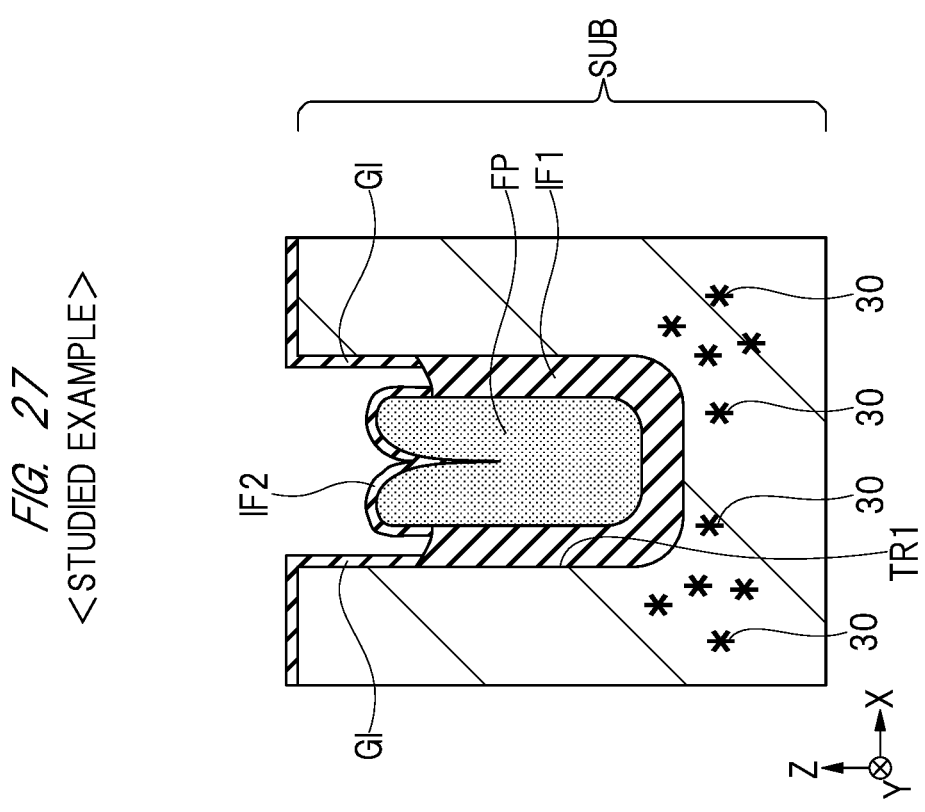

FIG. 27 is a cross-sectional view showing a manufacturing step subsequent to FIG. 26.

DETAILED DESCRIPTION

Hereinafter, embodiments will be described in detail with reference to the drawings. Note that, in all the drawings for describing the embodiments, the members having the same function are denoted by the same reference characters, and repetitive descriptions thereof will be omitted. Moreover, in the following embodiments, the description of the same or similar portions will not be repeated in principle unless particularly necessary.

Moreover, an X-direction, a Y-direction and a Z-direction described in this application intersect one another, and are perpendicular to one another. In this application, the Z-direction will be described as an up-down direction, a height direction, or a thickness direction of a certain structure. Further, an expression such as a "plan view" or "in plan view" for use in this application means that a plane formed by the X-direction and the Y-direction is defined as a "flat plane" and this "flat plane" is viewed from the Z-direction.

First Embodiment

Structure of Semiconductor Device

A semiconductor device 100 in the first embodiment will be described below with reference to FIG. 1 to FIG. 4. The semiconductor device 100 includes a MOSFET with a trench gate structure as a semiconductor element. Moreover, the MOSFET of the first embodiment forms a split gate structure including a gate electrode GE and a field plate electrode (fixed potential electrode) FP.

Figure 1:
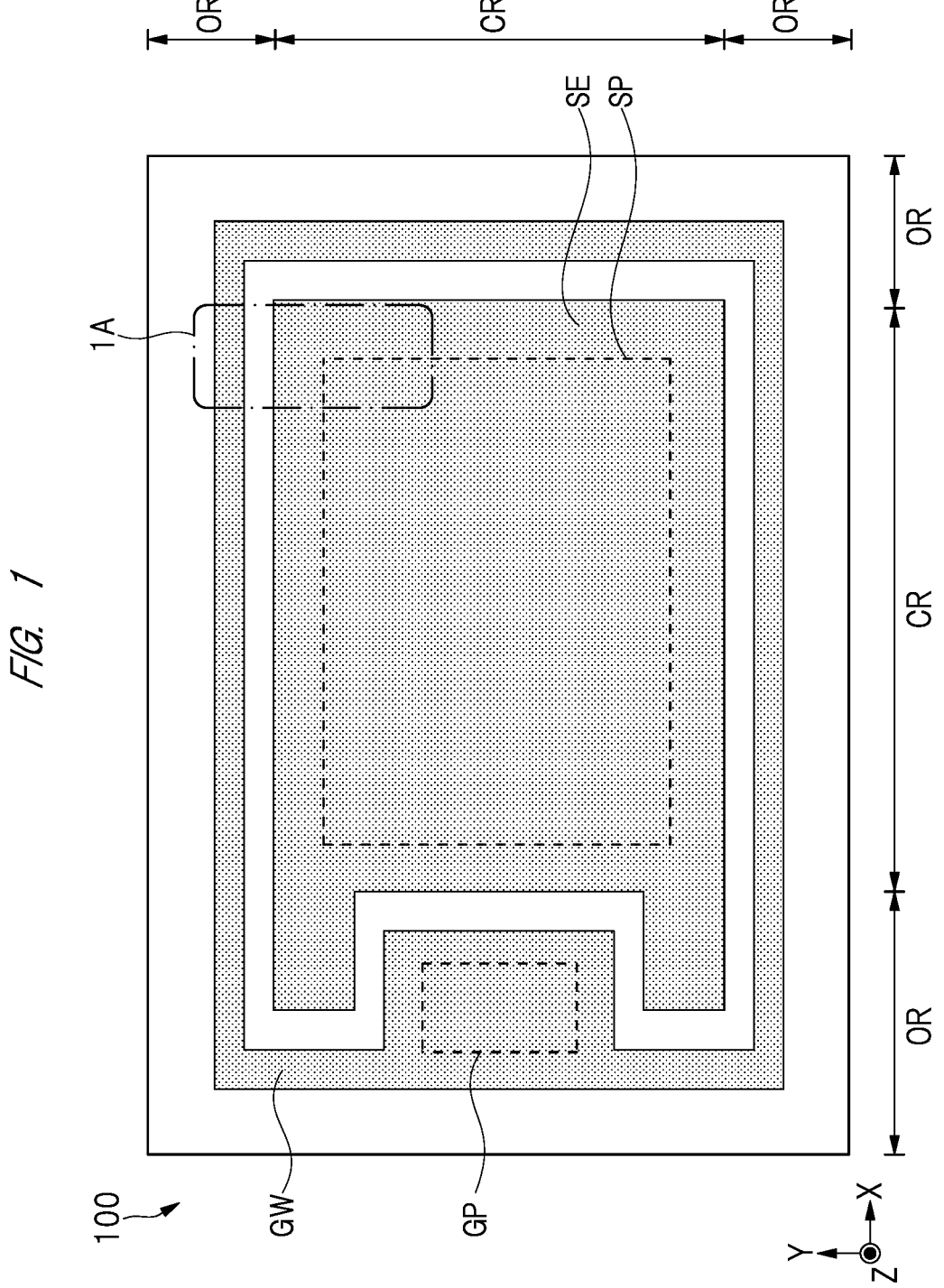
FIG. 1 is a plan view showing a semiconductor device in a first embodiment.
Figure 2:
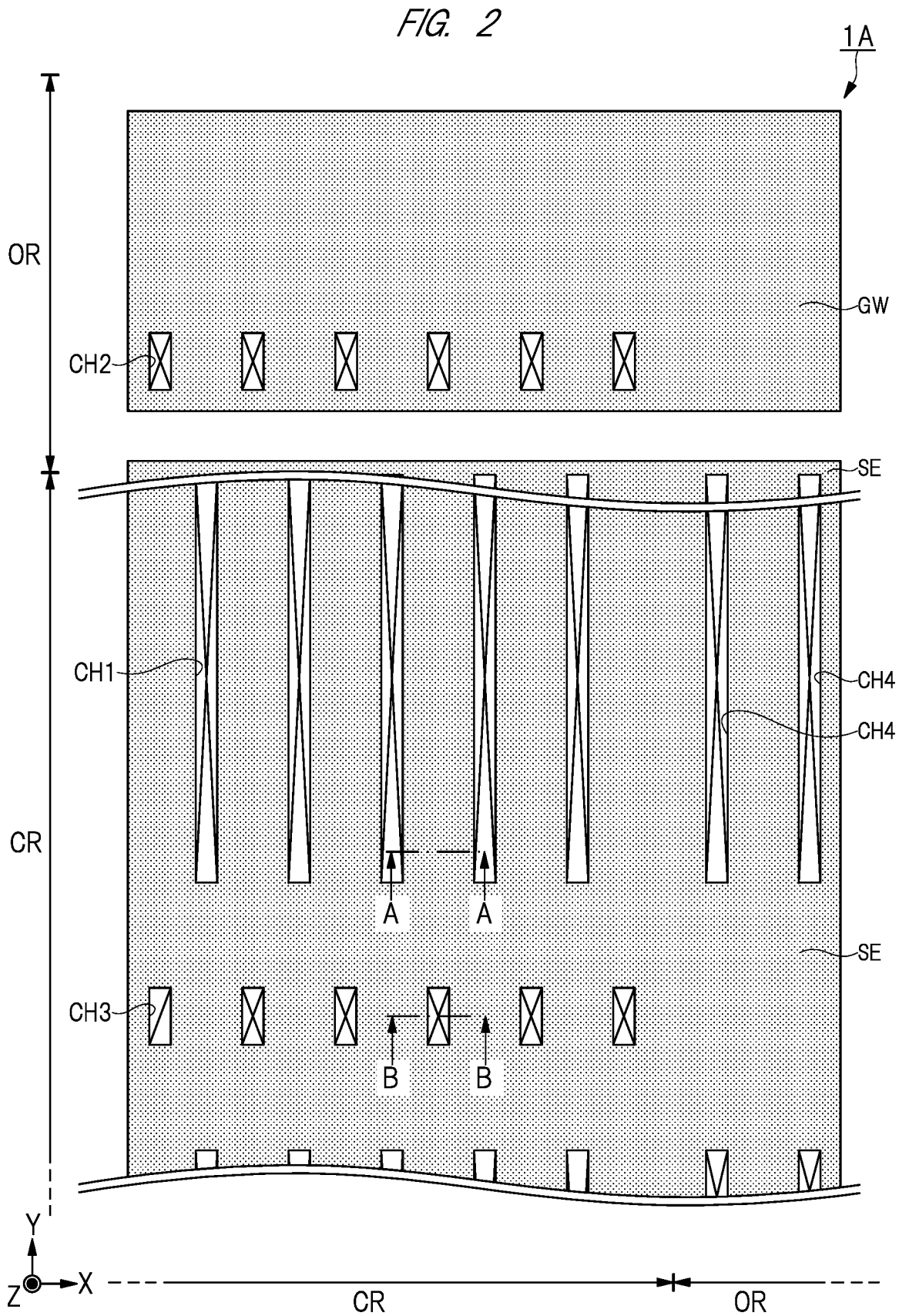
FIG. 2 is an enlarged plan view showing a main portion of the semiconductor device in the first embodiment.
Figure 3:
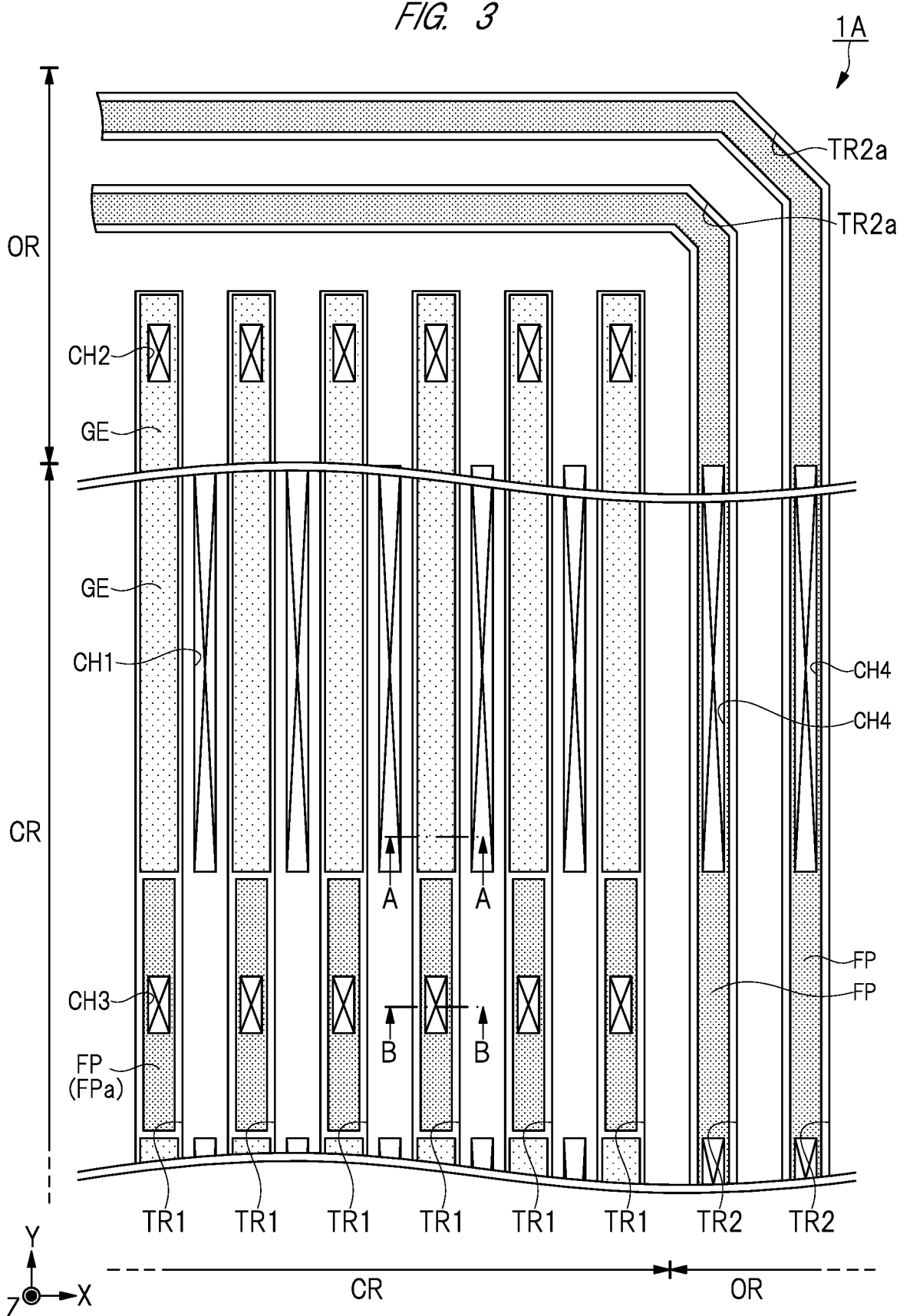
FIG. 3 is an enlarged plan view showing the main portion of the semiconductor device in the first embodiment.

FIG. 1 is a plan view of a semiconductor chip that is the semiconductor device 100. FIG. 1 mainly shows a wiring pattern formed above the semiconductor substrate SUB. FIG. 2 is a main portion plan view in which a region 1A shown in FIG. 1 is enlarged. FIG. 3 shows a structure blow FIG. 2, and shows a structure of a trench gate formed in the semiconductor substrate SUB.

As shown in FIG. 1, a most part of the semiconductor device 100 is covered with a source electrode (a fixed potential supply wiring) SE. A gate wiring GW is provided along an outer periphery of the semiconductor device 100, and surrounds the source electrode SE in plan view. Although not shown herein, the source electrode SE and the gate wiring GW are covered with a protective film such as a polyimide film. A part of the protective film is provided with openings, and the source electrode SE and the gate wiring GW which are exposed at those openings serve as a source pad SP and a gate pad GP. External connection members such as wires or clips (copper plates) are connected onto the source pad SP and the gate pad GP, so that the semiconductor device 100 is electrically connected to other semiconductor chips or wiring boards.

Moreover, the semiconductor device 100 includes a cell region CR and an outer periphery region OR that surrounds the cell region CR in plan view. In the cell region CR, principal semiconductor elements such as a plurality of MOSFETs are formed. The outer periphery region OR is used in order to connect the gate wiring GW to the gate electrode GE, to form trenches TR2 which function as termination regions, and so on.

Positions of holes CH1 to CH4 shown in FIG. 3 coincide with positions of holes CH1 to CH4 shown in FIG. 2. As shown in FIG. 3, in the cell region CR, the plurality of trenches TR1 extends in the Y-direction, and is adjacent to one another in the X-direction. A width of each of the trenches TR1 in the X-direction is, for example, 1.5 μm or more and 1.8 μm or less. Moreover, in the X-direction, each of the trenches TR1 is separated from others at an interval of 0.7 μm or more and 1.0 μm or less.

Inside the trench TR1, the field plate electrode FP is formed at a lower portion (a lower part) of the trench TR1, and the gate electrode GE is formed at an upper portion (an upper part) of the trench TR1. The field plate electrode FP and the gate electrode GE extend in the Y-direction along the trench TR1.

A part of the field plate electrode FP forms a contact portion FPa. Inside the trench TR1 in the cell region CR, the field plate electrode FP that composes the contact portion FPa is formed not only at the lower portion of the trench TR1 but also at the upper portion of the trench TR1.

In the outer periphery region OR, the trenches (termination trenches) TR2 are formed. The trenches TR2 extend in the Y-direction and the X-direction so as to surround the cell region CR. A width of the trenches TR2 is similar to that of the trenches TR1. Inside each of the trenches TR2, the field plate electrode FP is formed.

As shown in FIG. 3, the gate electrode GE, the contact portion FPa, and the field plate electrode FP in the trench TR2 are exposed. In the outer periphery region OR, holes CH2 are formed on the gate electrodes GE, and the gate electrodes GE are electrically connected to the gate wiring GW through the holes CH2. In the cell region CR, holes CH3 are formed on the contact portions FPa, and the contact portions FPa are electrically connected to the source electrode SE through the holes CH3. In the outer periphery region OR, on a part of the field plate electrodes FP, holes CH4 are formed, and the field plate electrodes FP are electrically connected to the source electrode SE through the holes CH4.

Figure 4:
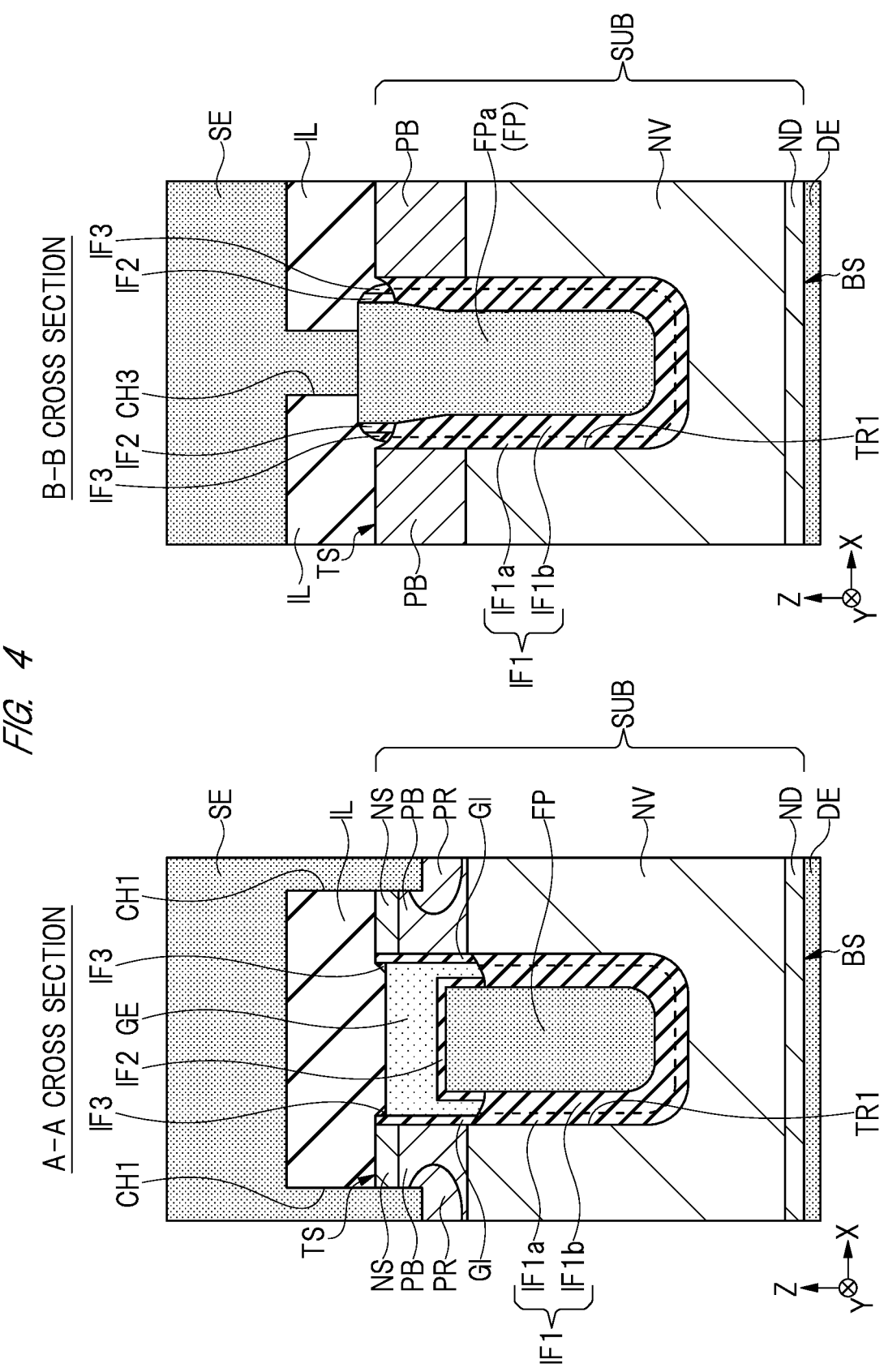
FIG. 4 is cross-sectional views showing the semiconductor device in the first embodiment.

With reference to FIG. 4, a cross-sectional structure of the semiconductor device 100 will be described below. FIG. 4 is cross-sectional views taken along the line A-A and the line B-B shown in FIG. 2 and FIG. 3.

First, with reference to the A-A cross section in FIG. 4, a basic structure of the MOSFET will be described. The semiconductor device 100 includes the semiconductor substrate SUB having an upper surface TS and a lower surface BS. The semiconductor substrate SUB has an n-type drift region NV with a low concentration. Herein, the n-type semiconductor substrate SUB itself constitutes the drift region NV. Note that the drift region NV may be an n-type semiconductor layer grown while introducing phosphorus (P) into an n-type silicon substrate by epitaxial growth. In this application, a description will be given on the assumption that a stacked body composed of such an n-type silicon substrate and an n-type semiconductor layer is also the semiconductor substrate SUB.

In the upper surface TS of the semiconductor substrate SUB, the plurality of trenches TR1 which reaches a predetermined depth from the upper surface TS of the semiconductor substrate SUB is formed. The depth of each of the trenches TR1 is, for example, 5 μm or more and 7 μm or less. Moreover, a depth of the trenches TR2 shown in FIG. 3 is also similar to that of each of the trenches TR1. Inside the trench TR1, the field plate electrode FP is formed at the lower portion of the trench TR1 via the insulating film IF1, and the gate electrode GE is formed at the upper portion of the trench TR1 via the gate insulating film GI.

A position of an upper surface of the insulating film IF1 is lower than a position of an upper surface of the field plate electrode FP. The gate insulating film GI is formed on the insulating film IF1 in the trench TR1. On an upper surface and side surface of the field plate electrode FP exposed from the insulating film IF1, the insulating film IF2 is formed. Moreover, the gate electrode GE is formed also between the field plate electrode FP exposed from the insulating film IF1 and the semiconductor substrate SUB via the gate insulating film GI and the insulating film IF2.

The insulating film IF1 is formed between the semiconductor substrate SUB and the field plate electrode FP. The insulating film IF2 is formed between the gate electrode GE and the field plate electrode FP. The gate insulating film GI is formed between the semiconductor substrate SUB and the gate electrode GE. By these insulating films, the semiconductor substrate SUB, the gate electrode GE, and the field plate electrode FP are electrically insulated from one another.

An upper surface of the gate electrode GE is retreated a little from the upper surface TS of the semiconductor substrate SUB. On an upper surface of a part of the gate electrode GE, an insulating film IF3 is formed so as to be in contact with the gate insulating film GI.

Each of the gate electrode GE and the field plate electrode FP is made of, for example, a polycrystalline silicon film into which n-type impurities are introduced. Each of the insulating film IF1, the insulating film IF2, the insulating film IF3, and the gate insulating film GI is made of, for example, a silicon oxide film.

A thickness of the insulating film IF1 is larger than a thickness of each of the insulating film IF2, the insulating film IF3, and the gate insulating film GI. For example, the thickness of the insulating film IF1 is 400 nm or more and 600 nm or less. For example, the thickness of each of the insulating film IF2 and the gate insulating film is 50 nm or more and 80 nm or less. For example, the thickness of the insulating film IF3 is 30 nm or more and 80 nm or less.

In the semiconductor substrate SUB (specifically, a position closer to the upper surface of the semiconductor substrate SUB than to the lower surface BS thereof), a p-type body region PB is formed so as to be shallower than the trench TR1. An n-type source region NS is formed in the body region PB. The source region NS has an impurity concentration higher than that of the drift region NV.

On a side closer to the lower surface BS of the semiconductor substrate SUB, an n-type drain region ND is formed in the semiconductor substrate SUB. The drain region ND has an impurity concentration higher than that of the drift region NV. Under the lower surface BS of the semiconductor substrate SUB, a drain electrode DE is formed. The drain electrode DE is made of, for example, a single metal film such as an aluminum film, a titanium film, a nickel film, a gold film, or a silver film, or a stacked film formed by depositing these metal films as appropriate.

On the upper surface TS of the semiconductor substrate SUB, an interlayer insulating film IL is formed so as to cover the trench TR1. The interlayer insulating film IL is made of, for example, a silicon oxide film. For example, a thickness of the interlayer insulating film IL is 700 nm or more and 900 nm or less. Note that the interlayer insulating film IL may be a stacked film of a thin silicon oxide film and a thick silicon oxide film containing phosphorus (PSG: Phospho Silicate Glass film).

In the interlayer insulating film IL, the hole CH1 that reaches the source region NS and the body region PB is formed. At the bottom of the hole CH1, a high concentration diffusion region PR is formed in the body region PB. The high concentration diffusion region PR has an impurity concentration higher than that of the body region PB.

On the interlayer insulating film IL, the source electrode SE is formed. The source electrode SE is embedded in the hole CH1. Moreover, the source electrode SE is electrically connected to the source region NS, the body region PB, and the high concentration diffusion region PR, and supplies a source potential (a fixed potential) to these.

Further, though not shown herein, in the interlayer insulating film IL, the hole CH2 shown in FIG. 2 and FIG. 3 is formed, and the gate wiring GW is formed on the interlayer insulating film IL. The hole CH2 reaches the gate electrode GE, and the gate wiring GW is embedded in the hole CH2. The gate wiring GW is electrically connected to the gate electrode GE, and supplies a gate potential to the gate electrode GE.

As shown in the B-B cross section of FIG. 4, a part of the field plate electrode FP composes the contact portion FPa of the field plate electrode FP. A position of an upper surface of the insulating film IF1 that is in contact with the field plate electrode FP other than the contact portion FPa is lower than a position of an upper surface of the insulating film IF1 that is in contact with the contact portion FPa. Namely, a position of an upper surface of the insulating film IF1 on the A-A cross section is located at a depth of 1.2 μm or more and 1.5 μm or less from the upper surface TS of the semiconductor substrate SUB. A position of an upper surface of the insulating film IF1 on the B-B cross section is located at a depth of 50 nm or more and 500 nm or less from the upper surface TS of the semiconductor substrate SUB.

Moreover, a position of an upper surface of the contact portion FPa is higher than a position of the upper surface TS of the semiconductor substrate SUB, and is located at a height of 200 nm or more and 400 nm or less from the upper surface TS of the semiconductor substrate SUB.

In the interlayer insulating film IL, the hole CH3 that reaches the contact portion FPa is formed. The source electrode SE is embedded in the hole CH3. The source electrode SE is electrically connected to the field plate electrode FP, and supplies the source potential to the field plate electrode FP.

Moreover, though not shown herein, the field plate electrode FP is formed also in the trench TR2 shown in FIG. 3 via the insulating film IF1. In the interlayer insulating film IL, the hole CH4 that reaches a part of the field plate electrode FP in the trench TR2 is formed. The source electrode SE is embedded in the hole CH4. The source electrode SE is electrically connected to the field plate electrode FP in the trench TR2, and supplies the source potential to the field plate electrode FP in the trench TR2. Namely, a cross-sectional view of the part in FIG. 3 in which the hole CH4 is located becomes the same as that of a structure of the B-B cross section in FIG. 4.

Moreover, each of the source electrode SE and the gate wiring GW is made of, for example, a barrier metal film and a conductive film formed on the barrier metal film. The barrier metal film is, for example, a titanium nitride film, and the conductive film is, for example, an aluminum film.

Note that each of the source electrode SE and the gate wiring GW may be made of a plug layer that fills the inside of each of the holes CH1 to CH4 and a wiring layer formed on the interlayer insulating film IL. In that case, the wiring layer is made of the barrier metal film and the conductive film mentioned above. The plug layer is made of, for example, a stacked film of a barrier metal film such as a titanium nitride film and a conductive film such as a tungsten film.

Method of Manufacturing Semiconductor Device

With reference to FIG. 5 to FIG. 20, respective manufacturing steps included in the method of manufacturing the semiconductor device 100 will be described below. In the following description, the A-A cross section and the B-B cross section in FIG. 4 will be used. Note that cross-sectional structures of the trenches TR2, the holes CH4, and the vicinities thereof in the outer periphery region OR are substantially the same as the structure of the B-B cross section in FIG. 4 as mentioned above. Further, since the description of manufacturing steps of these cross-sectional structures is also substantially the same as the description of the manufacturing steps of the B-B cross section, the detailed description thereof will be omitted.

Moreover, the main feature of the method of manufacturing the semiconductor device 100 in the first embodiment is in the manufacturing steps for forming the insulating film IF1 and the field plate electrode FP. Such a feature will be described as appropriate while being compared with the above-mentioned studied example.

Figure 5:
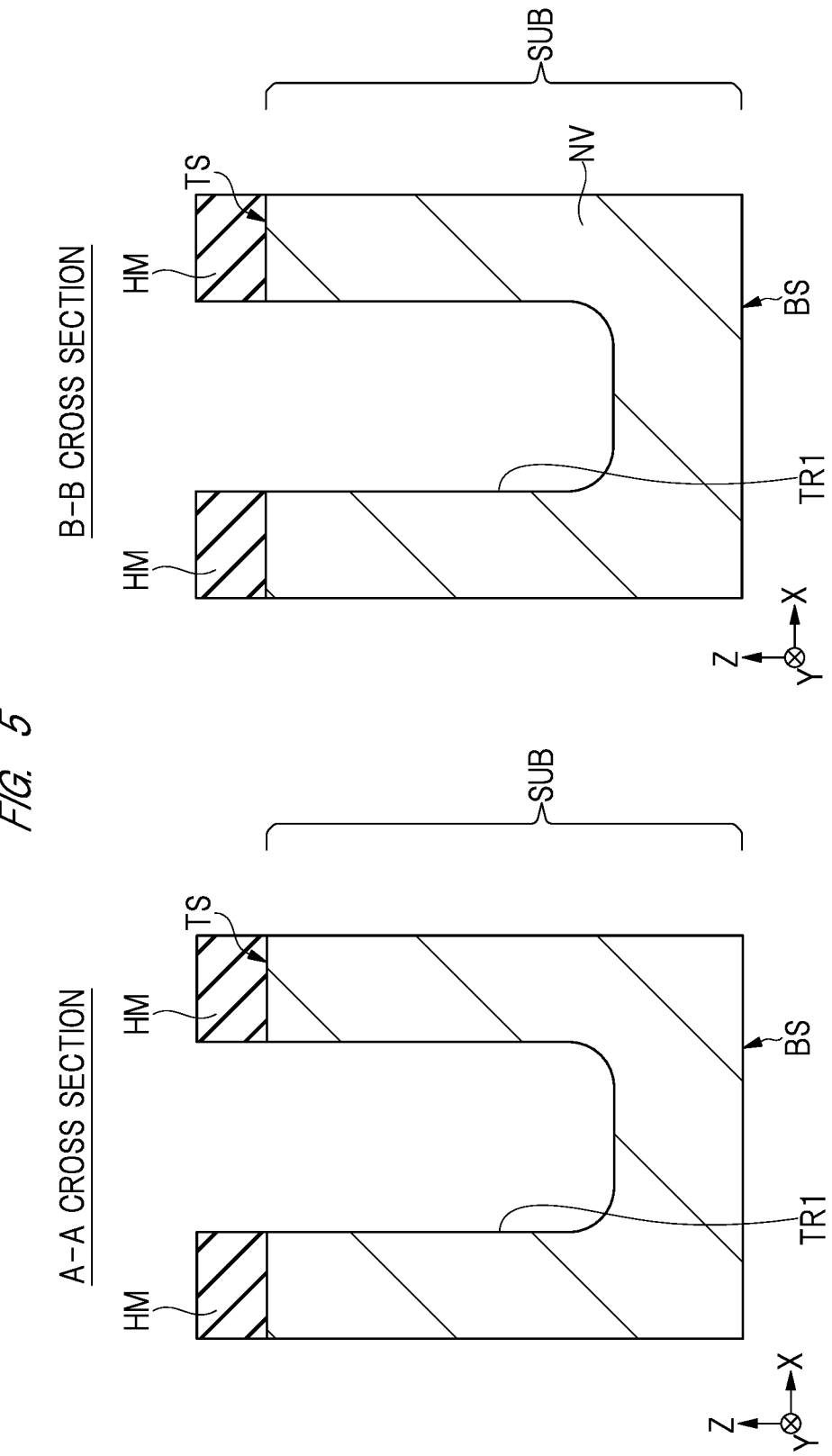
FIG. 5 is a cross-sectional view showing a manufacturing step of the semiconductor device in the first embodiment.

First, as shown in FIG. 5, the n-type semiconductor substrate SUB having the upper surface TS and the lower surface BS is prepared. Although the n-type semiconductor substrate SUB itself constitutes the drift region NV herein as mentioned above, the drift region NV may be such an n-type semiconductor layer grown while introducing phosphorus (P) into an n-type silicon substrate by epitaxial growth.

Next, the trench TR1 is formed in the upper surface TS of the semiconductor substrate SUB. In order to form the trench TR1, for example, a silicon oxide film is formed on the semiconductor substrate SUB by, for example, the CVD method. Next, on the oxide film, a resist pattern having an opening is formed by the photolithography technique. Next, an etching treatment (for example, the dry etching treatment) using the resist pattern as a mask is performed, so that the silicon oxide film is patterned to form a hard mask HM. Next, the resist pattern is removed by asking treatment. Next, an etching treatment (for example, the dry etching treatment) using the hard mask HM as a mask is performed, so that the trench TR1 is formed in the semiconductor substrate SUB. Thereafter, the hard mask HM is removed by an etching treatment (for example, the wet etching treatment) using a solution containing, for example, hydrofluoric acid.

Note that, in the outer periphery region OR, the trenches TR2 are formed by the same steps as those for forming the trenches TR1.

Figure 6:
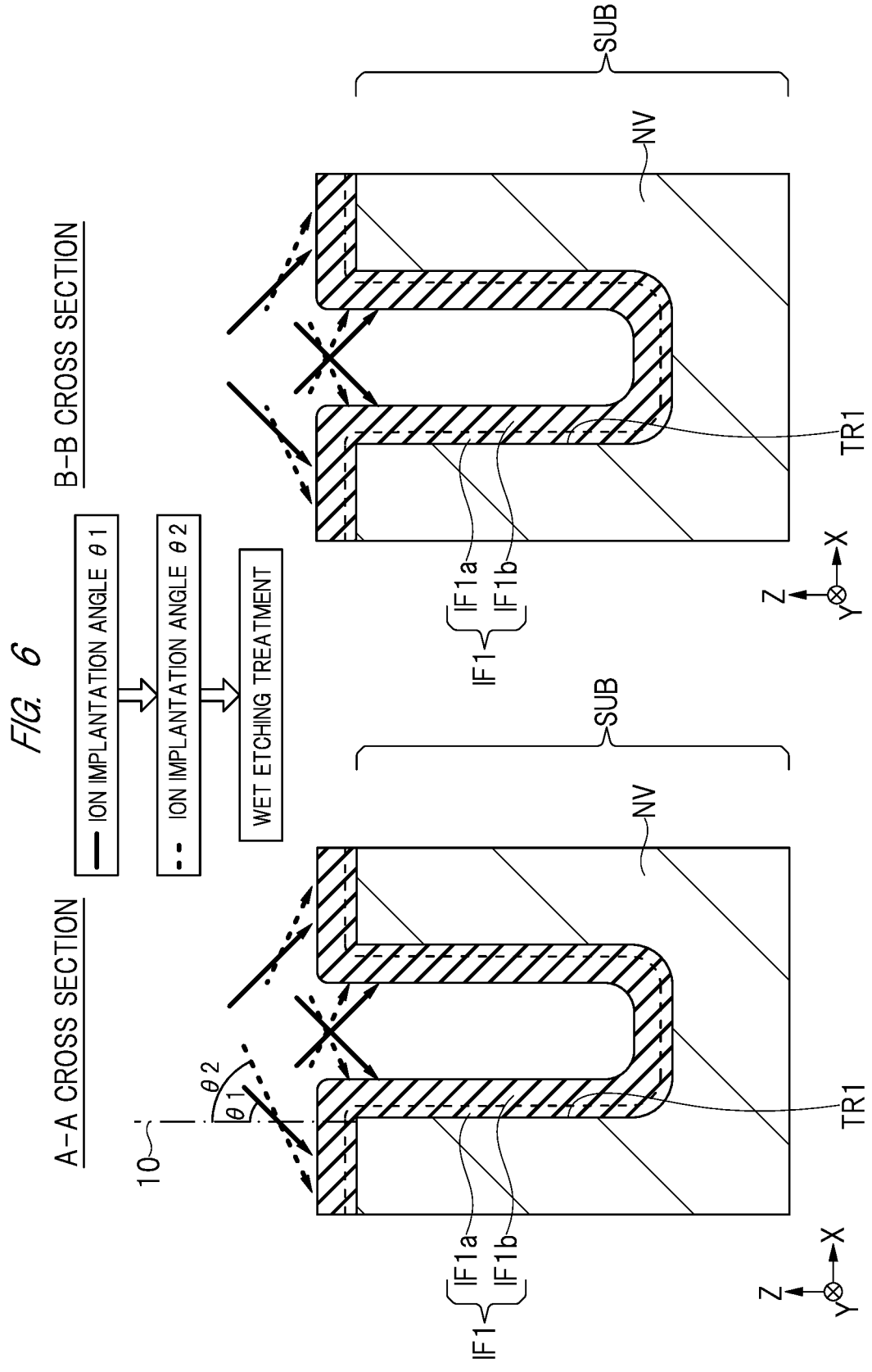
FIG. 6 is a cross-sectional view showing a manufacturing step subsequent to FIG. 5.

Next, as shown in FIG. 6, the insulating film IF1 made of, for example, a silicon oxide film is formed in the trench TR1 and on the semiconductor substrate SUB. First, a first silicon oxide film IF1a is formed in the trench TR1 and on the semiconductor substrate SUB by the thermal oxidation method. Next, on the first silicon oxide film IF1a, a second silicon oxide film IF1$b$ is formed by the CVD method. The insulating film IF1 is configured to include the first silicon oxide film IF1$a$ and the second silicon oxide film IF1$b$. For example, a thickness of the first silicon oxide film IF1$a$ is 100 nm or more and 200 nm or less. For example, a thickness of the second silicon oxide film IF1$b$ is 300 nm or more and 400 nm or less.

Although it is also possible to form the entire insulating film IF1 by the thermal oxidation method, a stress from the insulating film IF1 makes the semiconductor substrate SUB in a wafer state likely to warp in that case, causing an adverse effect on subsequent manufacturing steps. Meanwhile, considering an improvement of an interface state between the insulating film IF1 and the semiconductor substrate SUB, the silicon oxide film that is in contact with the semiconductor substrate SUB is preferably formed by the thermal oxidation method. Hence, in the first embodiment, the insulating film IF1 is composed of a stacked film of the first silicon oxide film IF1$a$ that is formed by the thermal oxidation method and is relatively thin and the second silicon oxide film IF1$b$ that is formed by the CVD method and is relatively thick.

Herein, when the CVD method is applied for forming the insulating film IF1, the thickness of the insulating film IF1 tends to be large on the uppermost portion (opening) of the trench TR1 as described with reference to FIG. 25 in the studied example, and the insulating film IF1 is likely to overhang. Then, as described with reference to FIG. 26 in the studied example, the void 20 is likely to occur in the conductive film CF1 at the time of forming the conductive film CF1.

Ion Implantation Process to Insulating Film IF1

Accordingly, in order to solve the above-described problem, the inventors of this application devised a technique for suppressing the insulating film from overhanging by performing an ion implantation to the insulating film IF1 at the upper portion of the trench TR1 and partially changing an etching rate of the etching treatment.

Specifically, first, as shown in FIG. 6, the ion implantation is performed to the insulating film IF1. This ion implantation is performed from a direction inclined by a predetermined angle from an extending direction of a normal line 10 (hereinafter, referred to as a "normal direction") with respect to the upper surface TS of the semiconductor substrate SUB. Herein, the case of performing the ion implantation twice is illustrated. The first ion implantation is performed from a direction inclined from the normal direction by an angle $\theta1$, and the second ion implantation is performed from a direction inclined from the normal direction by an angle $\theta2$. The angle $\theta1$ and the angle $\theta2$ are angles different from each other.

As such an implantation angle is larger, it becomes easier to implant ions into the insulating film IF1 close to the uppermost portion (opening) of the trench TR1. By reducing the implantation angle, the ions can be implanted into not only the vicinity of the uppermost portion of the trench TR1 but also the insulating film IF1 located away from the uppermost portion of the trench TR1.

As ion species for the ion implantation, for example, arsenic (As), phosphorus (P), or boron difluoride (BF$_2$) can be applied. A total implantation amount in the ion implantation is preferably $1\times10^{13}$/cm$^2$ or more. Moreover, the implantation angle (the angle $\theta1$ and the angle $\theta2$) in the ion implantation is preferably set within a range of 20 degrees or more and 60 degrees or less.

Note that, though the case of performing the ion implantation twice is illustrated herein, the ion implantation may be performed three times or more at angles different from one another. Moreover, the ion implantation does not necessarily need to be performed a plurality of times, and just needs to be performed at least once.

The etching rate of the etching treatment is different between the spot where the ions are implanted and the spot where the ions are not implanted. At the spot where the ions are implanted, the etching rate of the etching treatment becomes faster in comparison with the spot where the ions are not implanted. The etching rate becomes faster at such a spot where a larger number of ions are implanted.

After the above-mentioned ion implantation is performed to the insulating film IF1, the etching treatment is performed to the insulating film IF1 to reduce the thickness of the insulating film IF1. Note that an etching treatment with a larger isotropic component than an anisotropic component is used for the etching treatment performed to the insulating film IF1 after the ion implantation is performed thereto. Specifically, for example, the wet etching treatment using a solution that contains hydrofluoric acid is used. Thereby, an etching action to the insulating film IF works on not only in a thickness direction (Z-direction shown in FIG. 7) of the semiconductor substrate SUB but also in a direction along the upper surface TS (or the lower surface BS) of the semiconductor substrate SUB (X-direction shown in FIG. 7, the horizontal direction).

Figure 7:
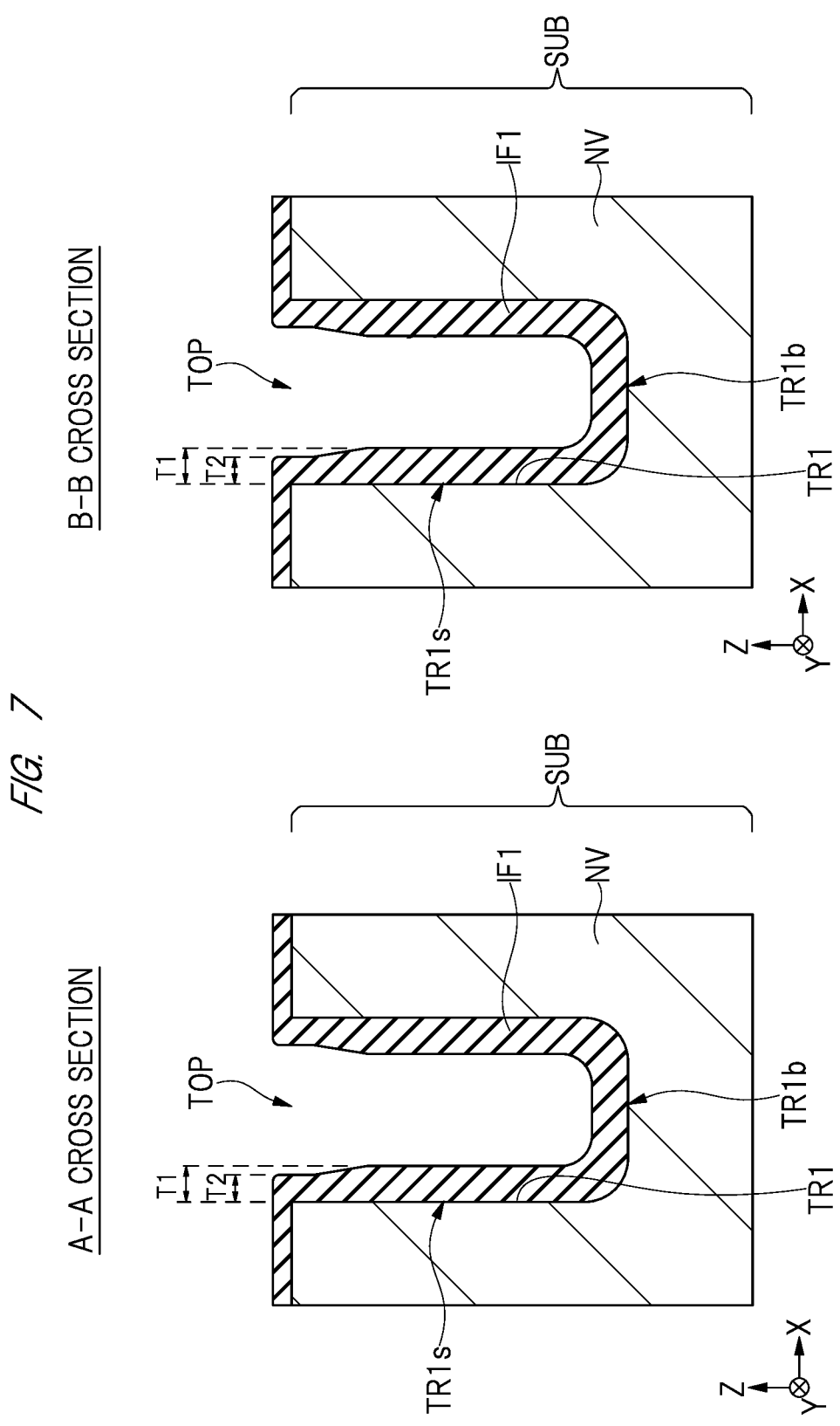
FIG. 7 is a cross-sectional view showing a manufacturing step subsequent to FIG. 6.

FIG. 7 shows a state of the insulating film IF1 after the etching treatment. The insulating film IF1 is generally thinned, and the thickness of the insulating film IF1 is further reduced in the vicinity of the uppermost portion (the opening) TOP of the trench TR1 into which the ions are implanted. For example, in the X-direction shown in FIG. 7, a thickness T2 of the insulating film IF1 at the position of the upper surface TS of the semiconductor substrate SUB is smaller than a thickness T1 of the insulating film IF1 at half the depth from the upper surface TS of the semiconductor substrate SUB to the deepest portion of the trench TR1. Hence, the overhang of the insulating film IF1 is eliminated and an aspect ratio thereof is improved, and therefore, the void 20 is less likely to occur in the conductive film CF1 at the time of forming the conductive film CF1 in the next step.

In other words, for example, the features regarding the thickness T1 and thickness T2 of the insulating film IF1 are as follows. The trench TR has a bottom surface TR1$b$ and a side surface (an inner wall surface) TR1$s$ in cross-sectional view. Note that the deepest portion of the trench TR1 is present in a part of the bottom surface TR1$b$. Namely, the bottom surface TR1$b$ and the side surface TR1$s$ do not intersect each other at a right angle, but strictly speaking, are rounded as shown in FIG. 7. In cross-sectional view, the insulating film IF1 has a first portion that is formed on the side surface TR1$s$ and is located at the uppermost portion (opening) TOP of the trench TR1 and a second portion that is formed on the side surface TR1$s$ and is located closer to the bottom surface TR1$b$ than the uppermost portion TOP of the trench TR1. A thickness of the first portion is smaller than a thickness of the second portion. Note that the "thickness" mentioned herein is a thickness based on the side surface TR1$s$ (thickness in the X-direction shown in FIG. 7) rather than a thickness based on the bottom surface TR1$b$.

For example, the thickness of the first portion corresponds to the thickness T2 of the insulating film IF1. Moreover, with regard to the second portion, the thickness T1 of the insulating film IF1 is included in the thickness of the second portion.

Forming Step of Field Plate Electrode FP

After the etching treatment to the insulating film IF1 subjected to the ion implantation, the field plate electrode FP is formed so as to fill the inside of the trench TR1 via the insulating film IF1 as shown in FIG. 8 to FIG. 11.

Figure 8:
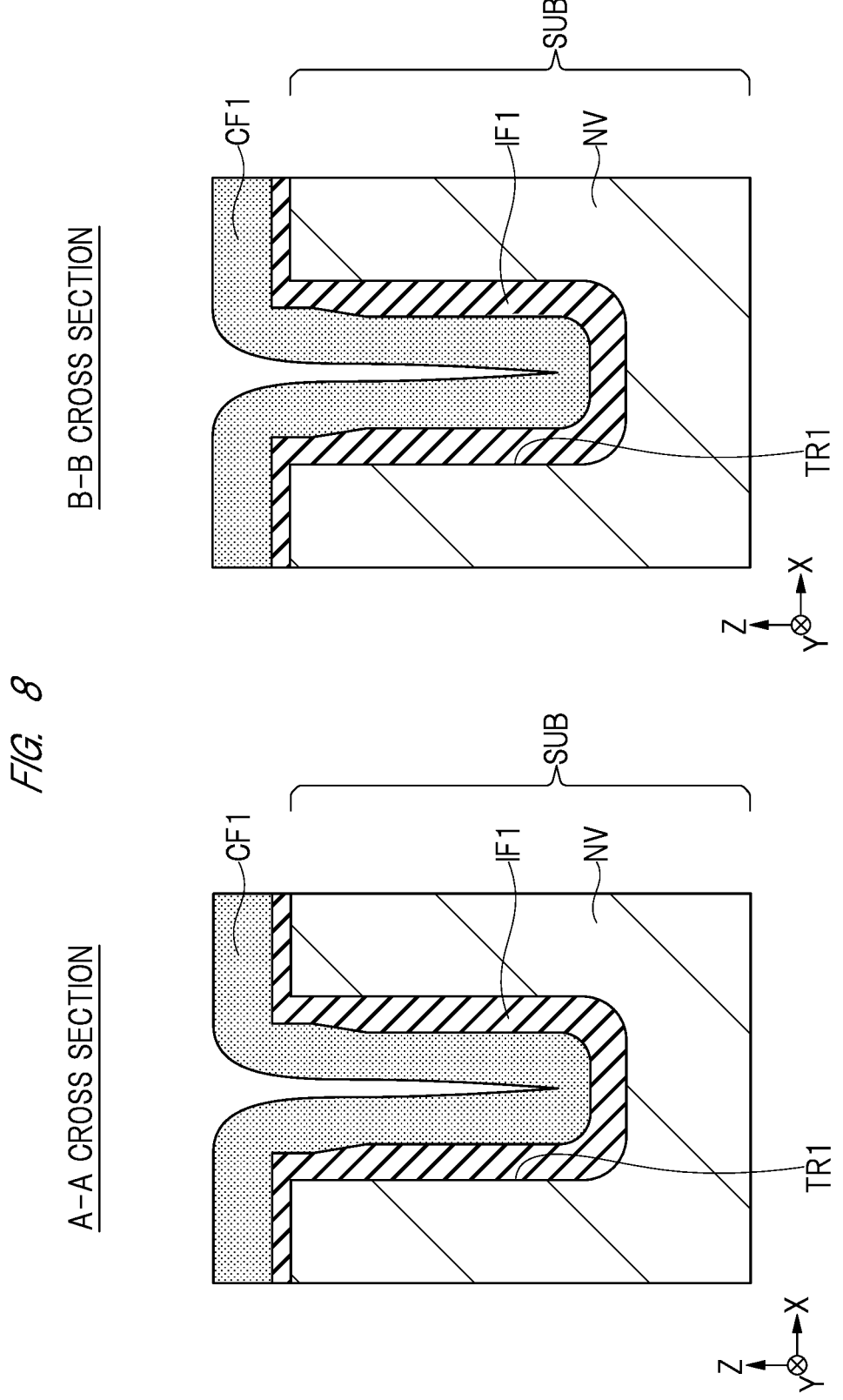
FIG. 8 is a cross-sectional view showing a manufacturing step subsequent to FIG. 7.

First, as shown in FIG. 8, on the insulating film IF1, the conductive film CF1 is formed by, for example, the CVD method. The conductive film CF1 is, for example, an n-type polycrystalline silicon film. At this time, the inside of the trench TR1 is not completely filled with the conductive film CF1. For example, a thickness of the conductive film CF1 is 200 nm or more and 300 nm or less.

Figure 9:
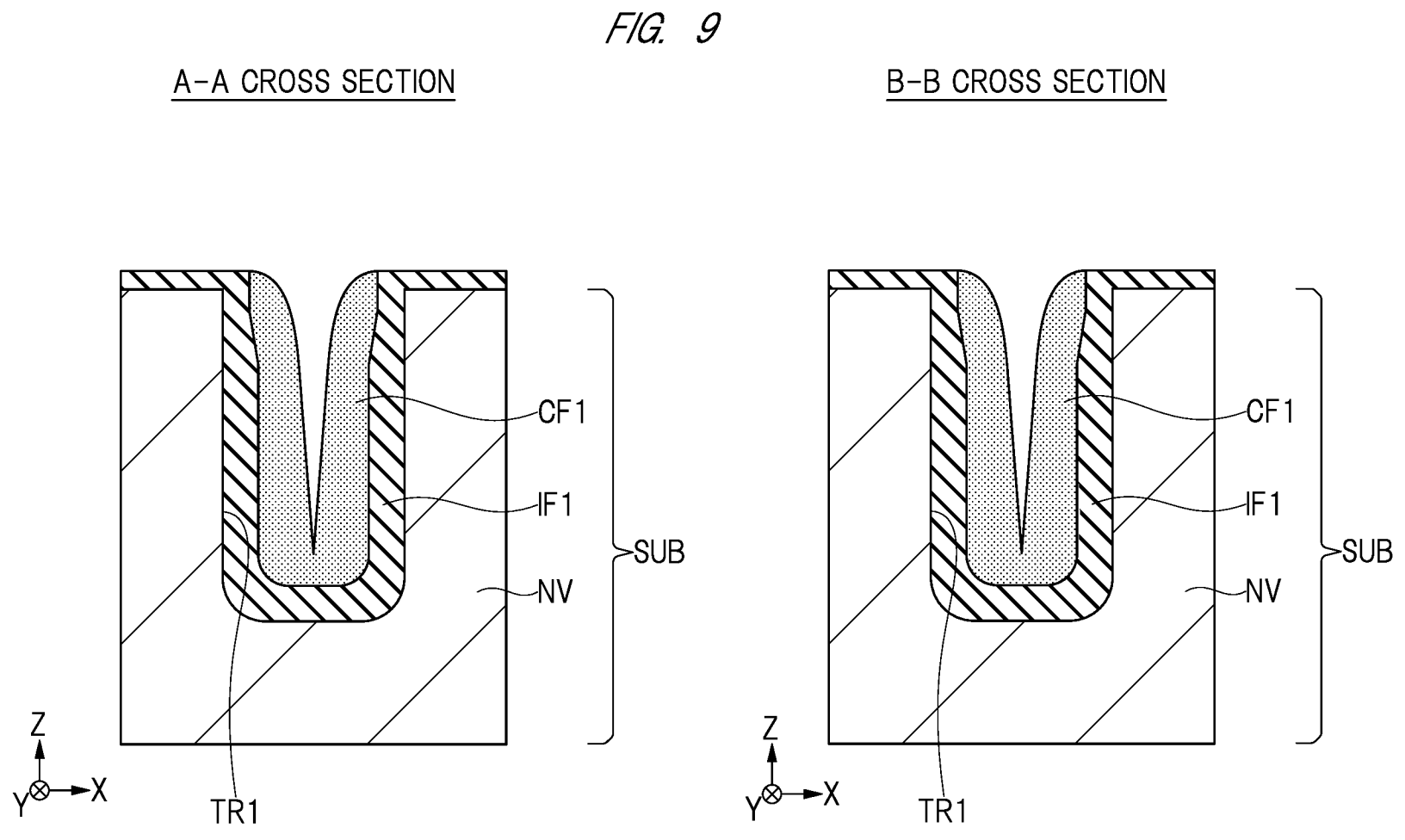

Next, as shown in FIG. 9, the etching treatment is performed to the conductive film CF1, so that the thickness of the conductive film CF1 is reduced. Note that an etching treatment with a larger anisotropic component than an isotropic component is used for the etching treatment performed to the conductive film CF1. Since the conductive film CF1 is processed into a sidewall shape in the trench TR1, the thickness of the conductive film CF1 becomes smaller as approaching the uppermost portion of the trench TR1.

Figure 10:
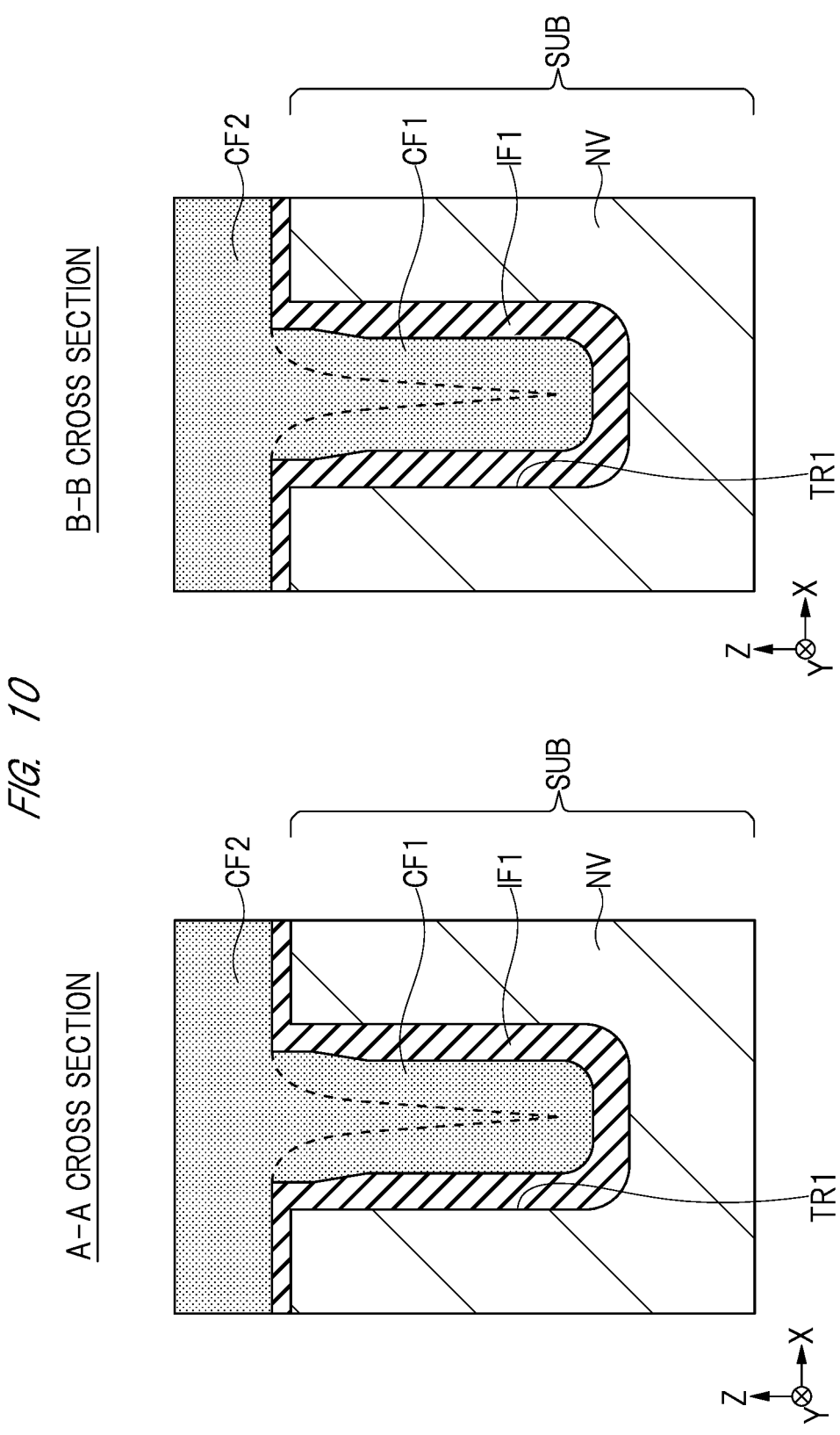
FIG. 10 is a cross-sectional view showing a manufacturing step subsequent to FIG. 9.

Next, as shown in FIG. 10, a conductive film CF2 is formed by, for example, the CVD method so as to fill the inside of the trench TR1 via the insulating film IF1 and the conductive film CF1. The conductive film CF2 is formed also on the insulating film IF1 outside the trench TR1. For example, the conductive film CF2 is an n-type polycrystalline silicon film. For example, a thickness of the conductive film CF2 is 800 nm or more and 1200 nm or less. In the manufacturing step in FIG. 9, since the thickness of the conductive film CF1 becomes smaller as approaching the uppermost portion of the trench TR1, the void 20 is less likely to occur in the conductive film CF2 at the time of forming the conductive film CF2.

Figure 11:
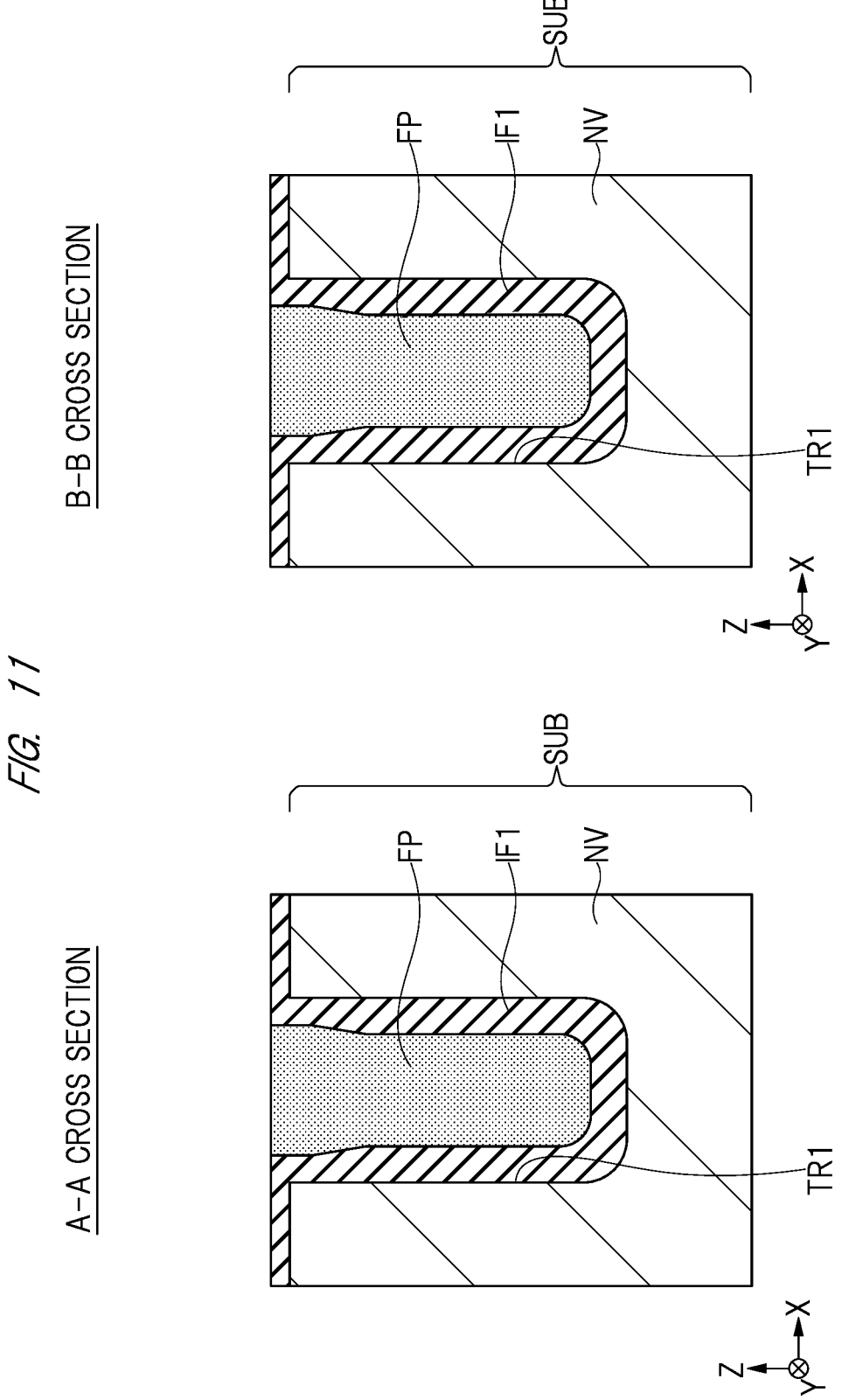
FIG. 11 is a cross-sectional view showing a manufacturing step subsequent to FIG. 10.

Next, as shown in FIG. 11, the conductive film CF2 formed outside the trench TR1 is removed by performing, for example, polishing treatment using the CMP (Chemical Mechanical Polishing) method or the etching treatment. Thereby, the field plate electrode FP which includes the conductive films CF1 and CF2 formed in the trench TR1 is formed. At this point of time, the position of the upper surface of the field plate electrode FP is higher than the position of the upper surface TS of the semiconductor substrate SUB.

As described above, the field plate electrode FP in which the occurrence of the void 20 is suppressed can be formed. Note that, even if each of the ion implantation and the etching treatment in FIG. 6 is not performed and the thickness of the insulating film IF1 does not satisfy the relationship ("T2<T1") in FIG. 7, the forming method of the field plate electrode FP described with reference to FIG. 8 to FIG. 11 is effective as a method for suppressing the occurrence of the void 20.

Figure 12:
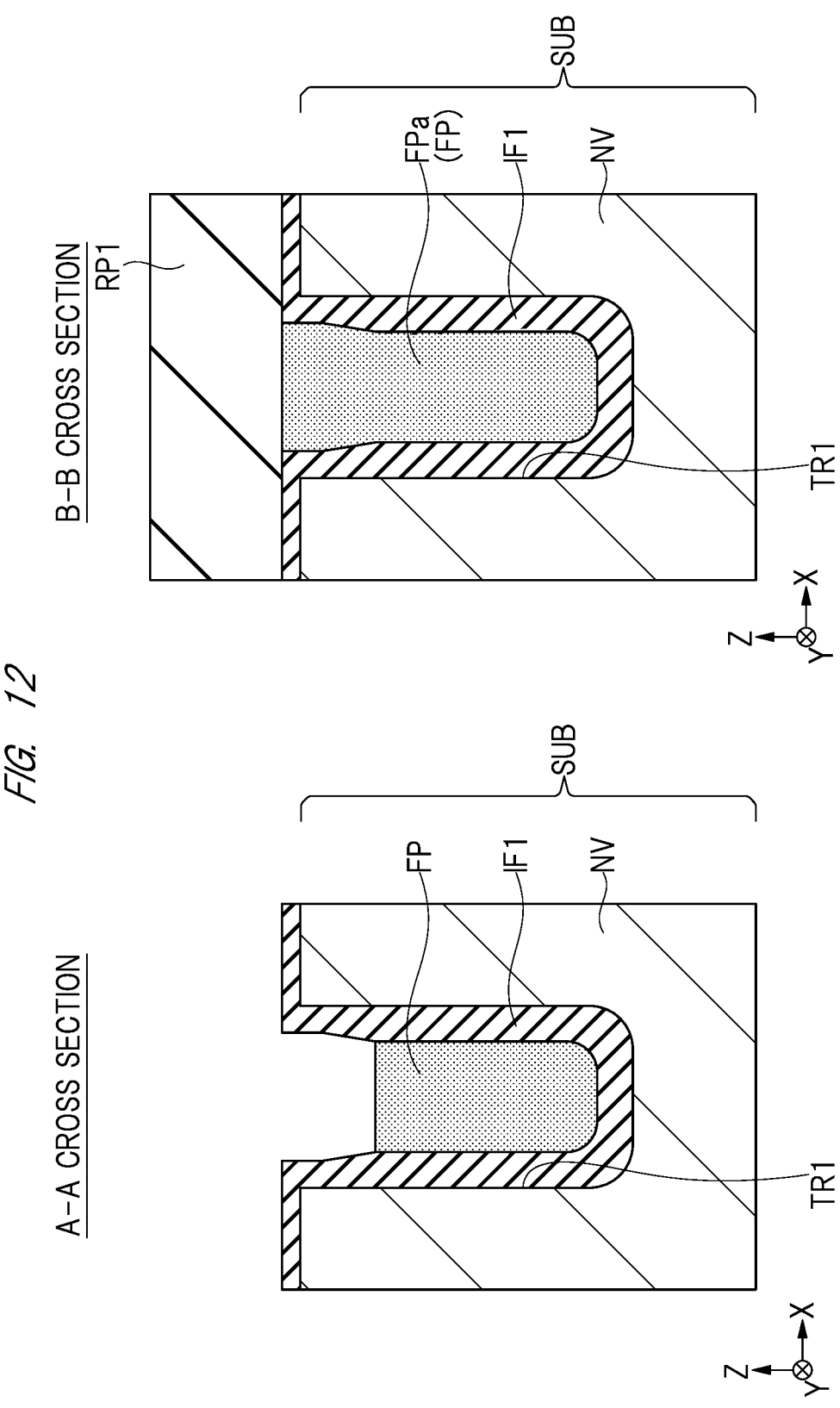
FIG. 12 is a cross-sectional view showing a manufacturing step subsequent to FIG. 11.

Next, as shown in FIG. 12, in order that a part of the field plate electrode FP is left as the contact portion FPa (the B-B cross section), the other portion of the field plate electrode FP is selectively retreated (the A-A cross section). First, a resist pattern RP1 that selectively covers a region serving as the contact portion FPa is formed. Next, the etching treatment (for example, the dry etching treatment) using the resist pattern RP1 as a mask is performed. Thereby, the field plate electrode FP other than the contact portion FPa is selectively retreated. Thereafter, the resist pattern RP1 is removed by the asking treatment.

Figure 13:
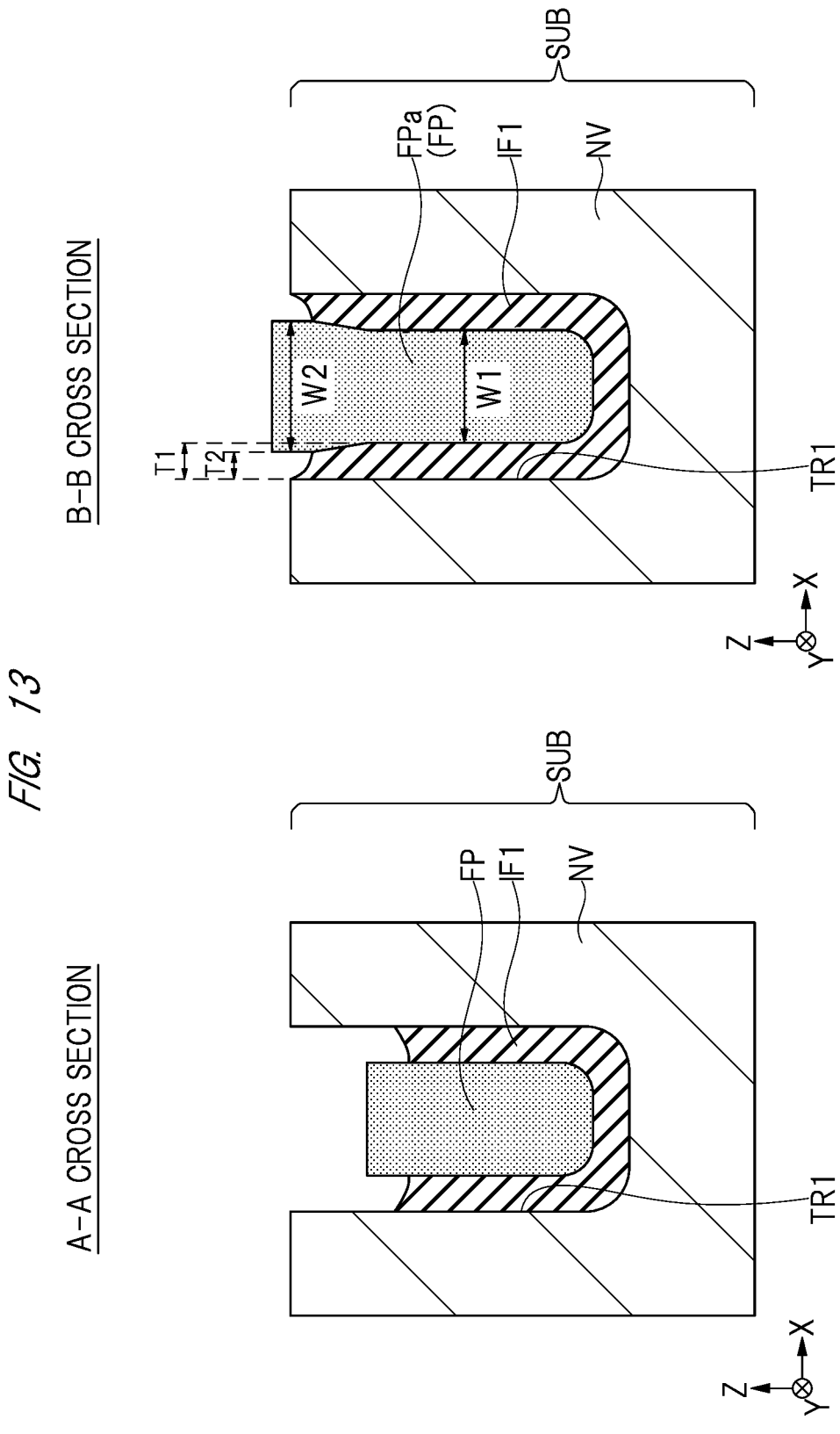
FIG. 13 is a cross-sectional view showing a manufacturing step subsequent to FIG. 12.

Next, as shown in FIG. 13, a part of the insulating film IF1 is removed by the etching treatment (for example, the wet etching treatment). Thereby, the insulating film IF1 on the semiconductor substrate SUB is removed, and further, the position of the upper surface of the insulating film IF1 becomes lower than the position of the upper surface of the field plate electrode FP in the trench TR1. Namely, the insulating film IF1 is retreated. Moreover, in the region in which the field plate electrode FP is retreated (the A-A cross section), a part of the insulating film IF1 is exposed in the trench TR1, and therefore, the etching to the insulating film IF1 progresses fast.

At this point of time, the position of the upper surface of the insulating film IF1 that is in contact with the field plate electrode FP other than the contact portion FPa is lower than the position of the upper surface of the insulating film IF1 that is in contact with the contact portion FPa. Moreover, since the insulating film IF1 on the semiconductor substrate SUB is removed, the position of the upper surface of the contact portion FPa is higher than the position of the upper surface TS of the semiconductor substrate SUB.

Also, since the field plate electrode FP is formed along the shape of the insulating film IF1, a width W2 of the upper portion of the contact portion FPa is larger than a width W1 of the lower portion of the contact portion FPa as shown in the B-B cross section. For example, in the X-direction, the width W2 of the contact portion FPa at the position of the upper surface TS of the semiconductor substrate SUB is larger than the width W1 of the contact portion FPa at half the depth from the upper surface TS of the semiconductor substrate SUB to the deepest portion of the trench TR1.

Figure 14:
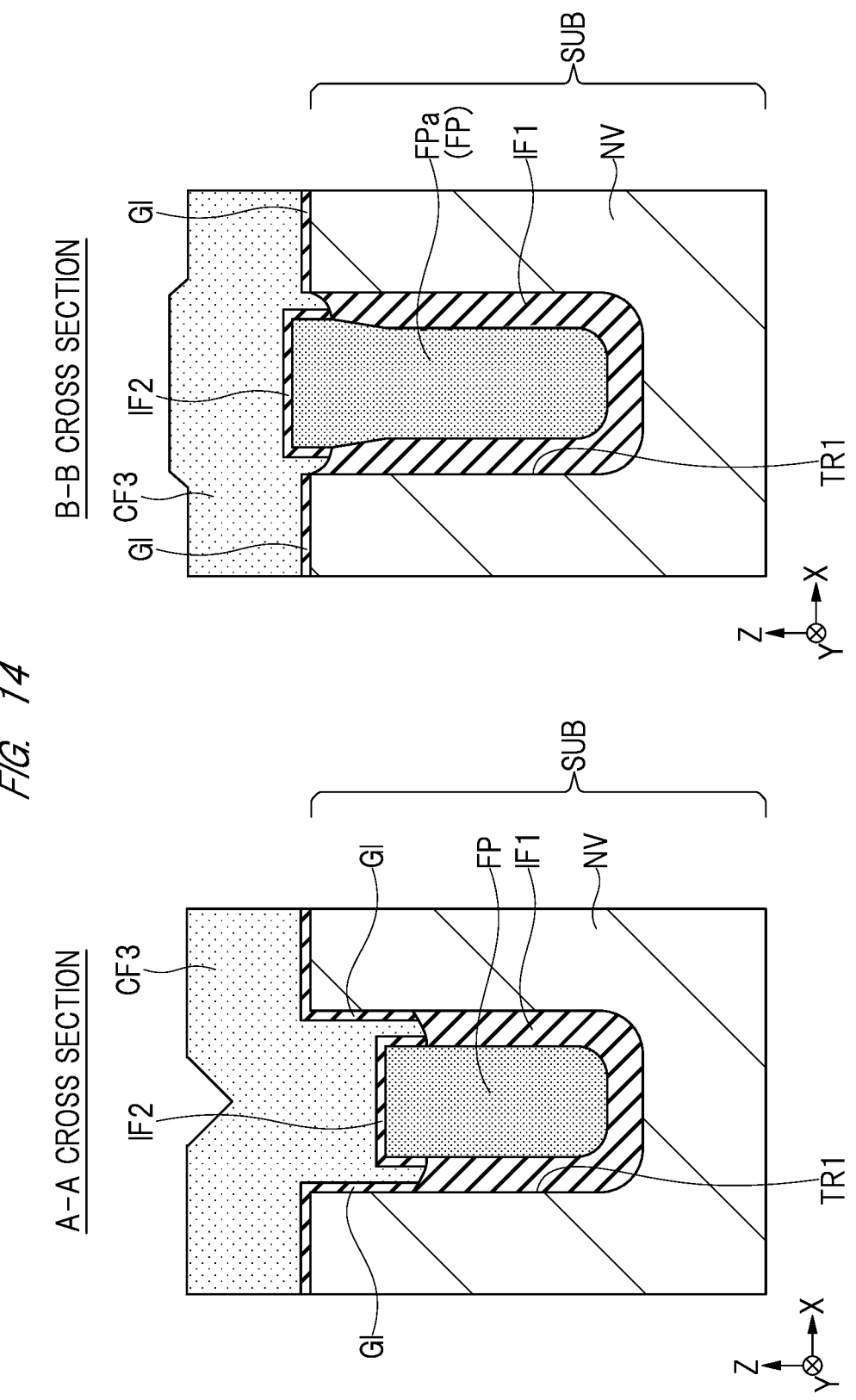
FIG. 14 is a cross-sectional view showing a manufacturing step subsequent to FIG. 13.

Next, as shown in FIG. 14, the gate insulating film GI made of, for example, a silicon oxide film is formed by the thermal oxidation method in the trench TR1 on the insulating film IF1 and on the semiconductor substrate SUB. At the same time, the insulating film IF2 is formed on the upper surface and side surface of the field plate electrode FP exposed from the insulating film IF1.

Next, on the field plate electrode FP retreated in the manufacturing step in FIG. 12, a conductive film CF3 is formed in the trench TR1 and on the semiconductor substrate SUB by, for example, the CVD method so as to fill the inside of the trench TR1 (the A-A cross section). Herein, the conductive film CF3 is formed also in the trench TR1 in which the contact portion FPa is formed (the B-B cross section). For example, the conductive film CF3 is an n-type polycrystalline silicon film. For example, a thickness of the conductive film CF3 is 800 nm or more and 1200 nm or less.

Figure 15:
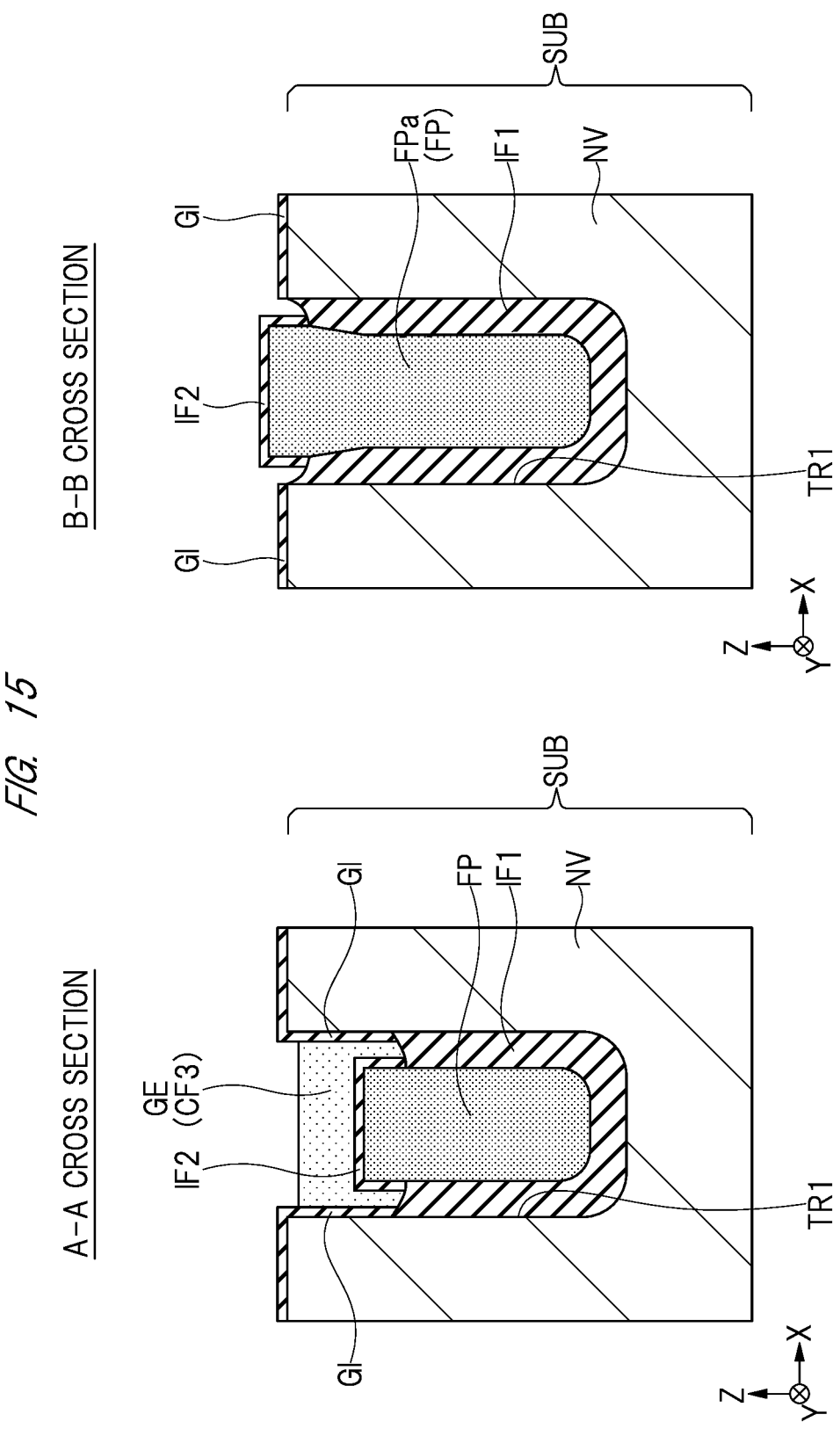
FIG. 15 is a cross-sectional view showing a manufacturing step subsequent to FIG. 14.

Next, as shown in FIG. 15, the etching treatment (for example, the dry etching treatment) is performed to the conductive film CF3, so that the conductive film CF3 formed outside the trench TR1 is removed, and the gate electrode GE is formed in the trench TR1 (the A-A cross section). By this etching treatment, the conductive film CF3 is removed in the trench TR1 in which the contact portion FPa is formed (the B-B cross section).

Note that, in order to completely remove the conductive film CF3 in the trench TR1 in which the contact portion FPa is formed and the conductive film CF3 outside the trench TR1, over-etching is implemented to the conductive film CF3 in this etching treatment. Therefore, as shown in the A-A cross section of FIG. 15, the position of the upper surface of the gate electrode GE becomes a little lower than the position of the upper surface TS of the semiconductor substrate SUB.

Figure 16:
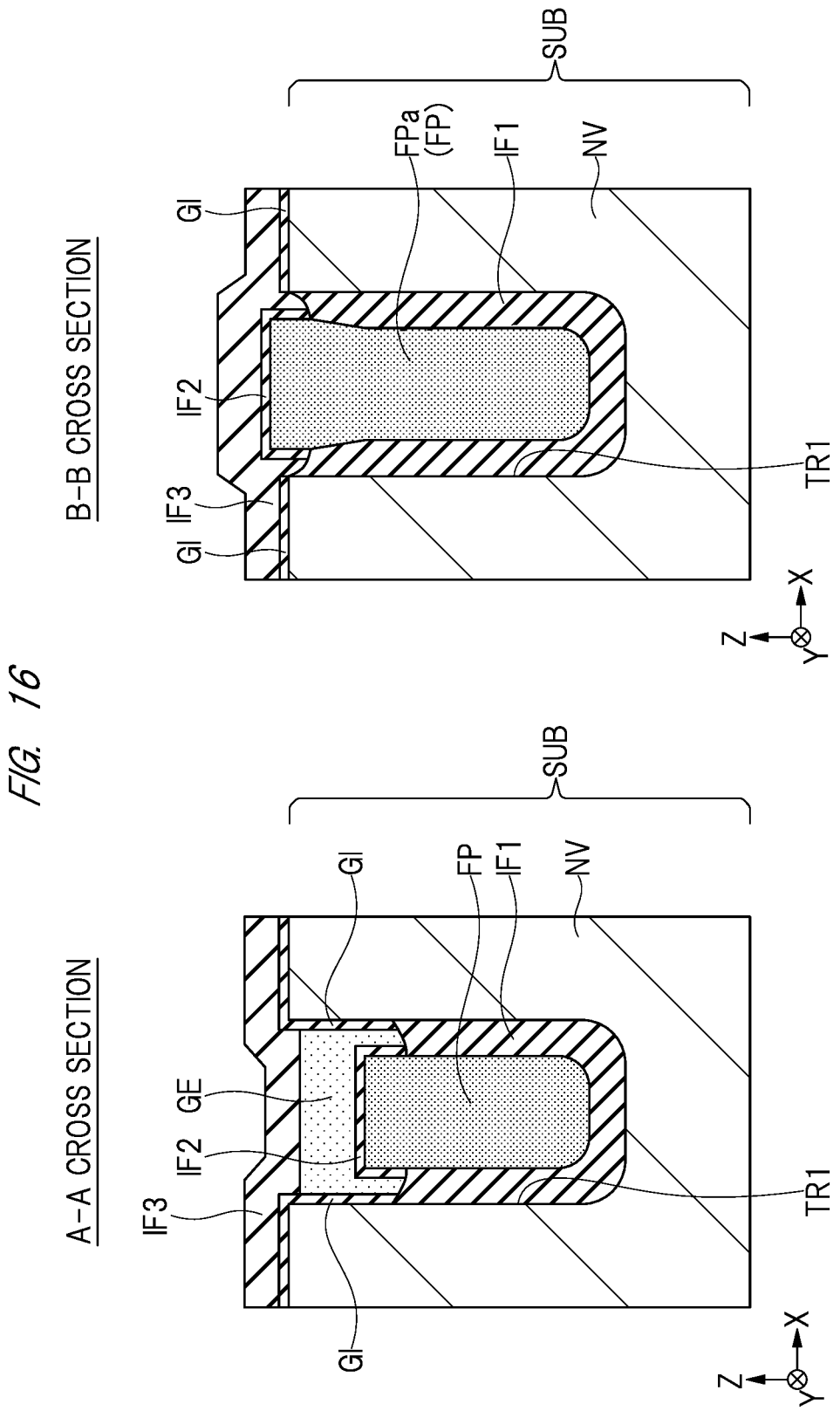
FIG. 16 is a cross-sectional view showing a manufacturing step subsequent to FIG. 15.

Next, as shown in FIG. 16, the insulating film IF3 is formed on the upper surface TS of the semiconductor substrate SUB by, for example, the CVD method so as to cover the trench TR1. For example, the insulating film IF3 is formed of, for example, a silicon oxide film or a silicon nitride film.

Figure 17:
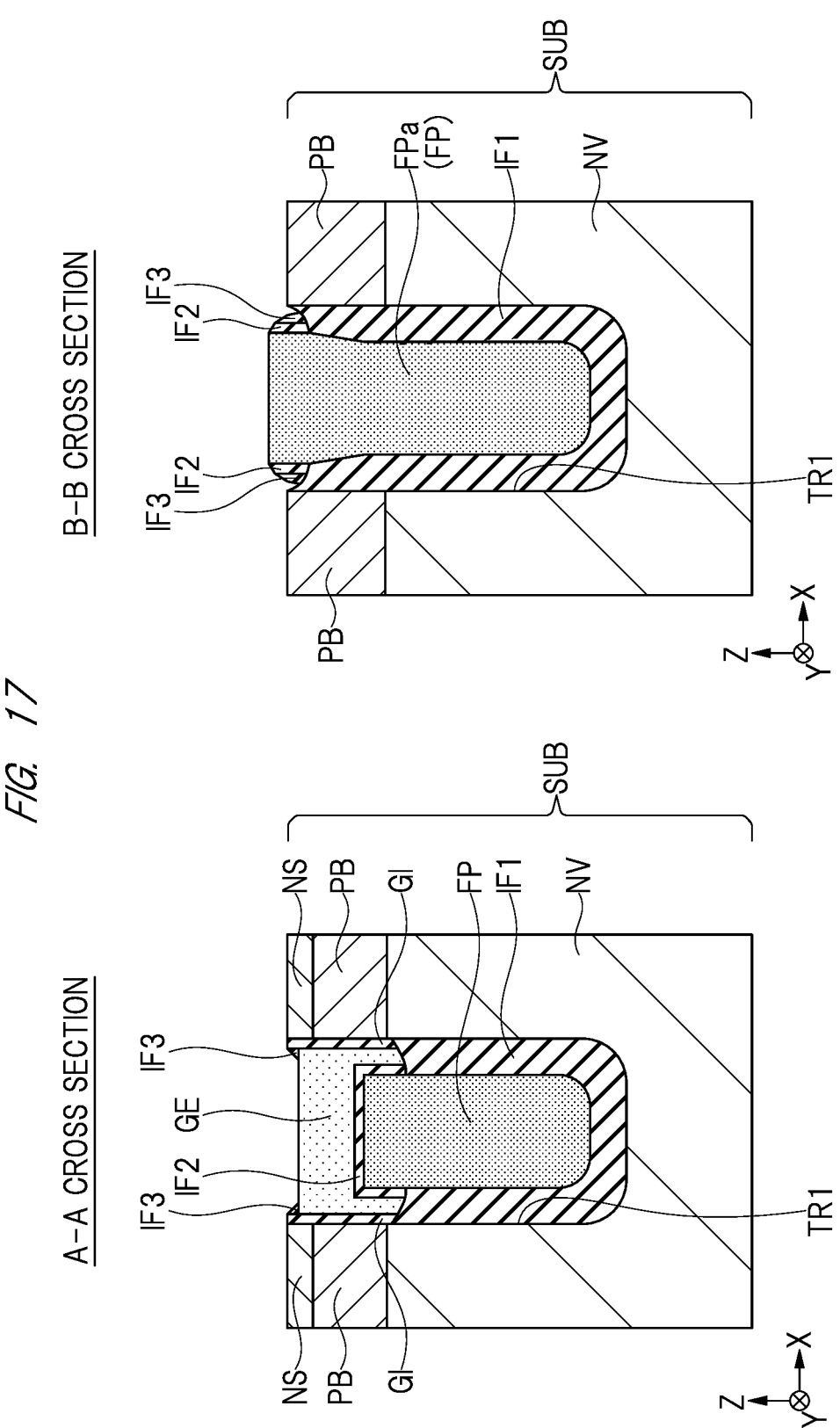
FIG. 17 is a cross-sectional view showing a manufacturing step subsequent to FIG. 16.

Next, as shown in FIG. 17, first, the etching treatment (for example, the dry etching treatment) is performed to the insulating film IF3. Thereby, on the upper surface of a part of the gate electrode GE, the insulating film IF3 is left so as to be in contact with the gate insulating film GI (the A-A cross section). Moreover, on the side surface of the contact portion FPa, the insulating film IF3 is left via the insulating film IF2 (the B-B cross section).

Next, as shown in FIG. 17, at a position closer to the upper surface TS of the semiconductor substrate SUB than to the lower surface BS of the semiconductor substrate SUB, for example, boron (B) is introduced by the ion implantation method, so that the p-type body region PB is formed in the semiconductor substrate SUB. The body region PB is formed so as to be shallower than the trench TR1. Next, after covering the periphery of the contact portion FPa with the resist pattern, for example, arsenic (As) is introduced there-into by the ion implantation method, so that the n-type source region NS is formed in the body region PB. Next, the resist pattern is removed by the asking treatment. Thereafter, heat treatment is implemented to the semiconductor sub-strate SUB, so that impurities contained in the source region NS and the body region PB are diffused.

Note that a thin silicon oxide film may be formed as a through-film in advance on the semiconductor substrate SUB before the ion implantation into the source region NS and the body region PB. This through-film may be removed after the ion implantation, or may be left as a part of the interlayer insulating film IL.

Figure 18:
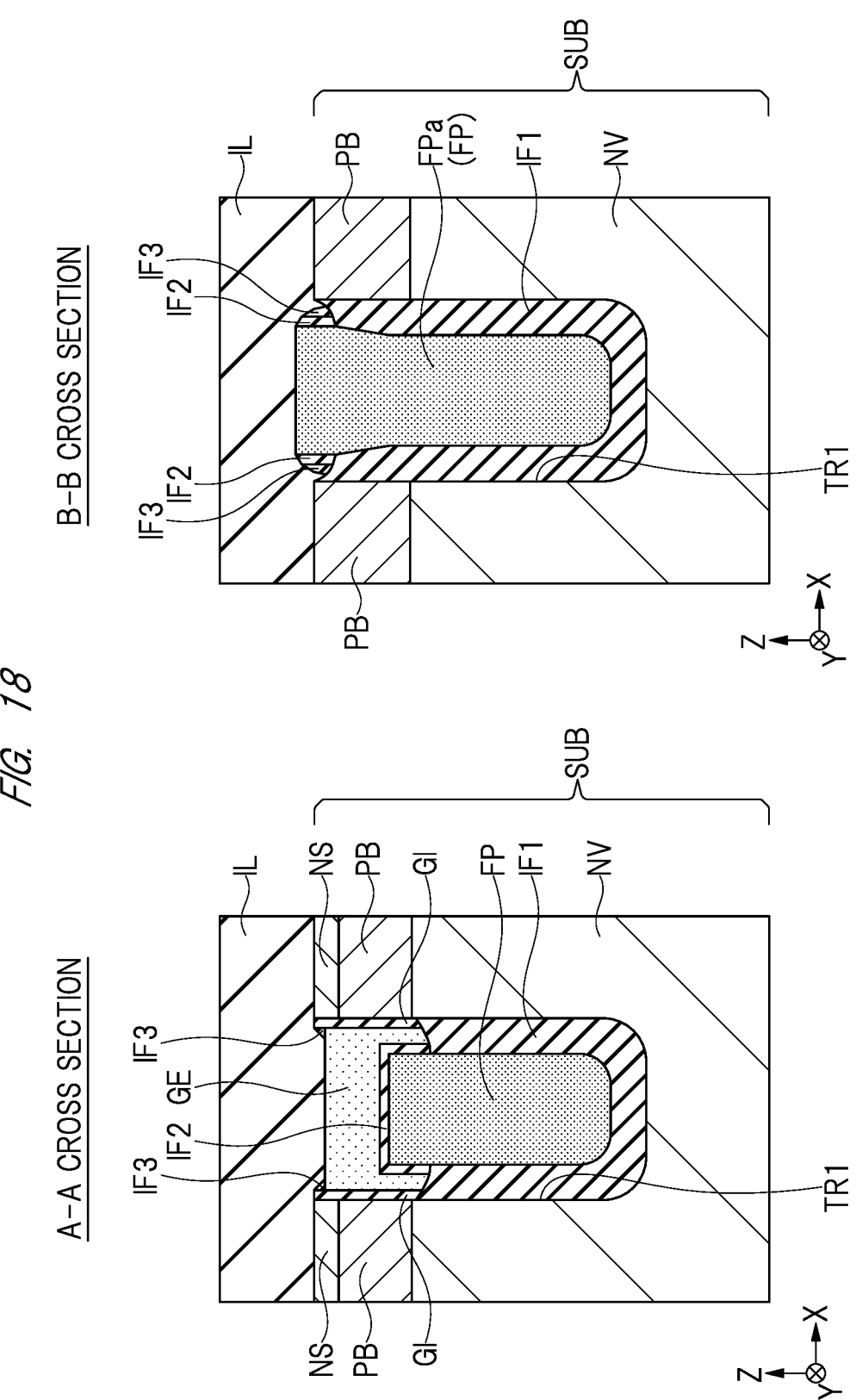
FIG. 18 is a cross-sectional view showing a manufacturing step subsequent to FIG. 17.

Next, as shown in FIG. 18, the interlayer insulating film IL is formed by, for example, the CVD method on the upper surface TS of the semiconductor substrate SUB so as to cover the trench TR1. For example, the interlayer insulating film IL is made of a silicon oxide film. Note that the interlayer insulating film IL may be a stacked film of a thin silicon oxide film formed by the CVD method and a PSG film formed by the coating method.

Next, as shown in FIG. 19, the holes CH1 to CH4 are formed in the interlayer insulating film IL. Though the hole CH2 and the hole CH4 are not illustrated, the hole CH2 and the hole CH4 are formed in the same step as the step for forming the hole CH3.

First, a resist pattern having a pattern that opens the semiconductor substrate SUB in which the source region NS is formed is formed on the interlayer insulating film IL. Next, the etching treatment (for example, the dry etching treatment) using the above-described resist pattern as a mask is performed, so that the hole CH1 that reaches the inside of the source region NS and the inside of the body region PB is formed in the interlayer insulating film IL. The bottom of the hole CH1 is located in the body region PB. Next, for example, boron (B) is introduced into the body region PB at the bottom of the hole CH1 by the ion implantation method, so that the p-type high concentration diffusion region PR is formed. Thereafter, the resist pattern is removed by the asking treatment.

Next, a resist pattern having a pattern that opens the gate electrode GE in the outer periphery region OR, the contact portion FPa in the cell region CR, and the field plate FP in the outer periphery region OR is formed on the interlayer insulating film IL. Next, the etching treatment (for example, the dry etching treatment) using the resist pattern as a mask is performed, so that the hole CH2 that reaches the gate electrode GE, the hole CH3 that reaches the contact portion FPa, and the hole CH4 that reaches the field plate electrode FP of the outer periphery region OR are formed in the interlayer insulating film IL. Thereafter, the resist pattern is removed by the asking treatment.

Note that either of the step for forming the hole CH1 and the step for forming the holes CH2 to CH4 may be per-formed first.

Next, as shown in FIG. 20, the source electrode SE and the gate wiring GW that surrounds the source electrode SE in plan view are formed on the interlayer insulating film IL. First, on the interlayer insulating film IL, a stacked film of a barrier metal film made of, for example, a titanium nitride film and a conductive film made of, for example, an alumi-num film is formed by the sputtering method or the CVD method. Next, the source electrode SE and the gate wiring GW are formed by patterning the stacked film.

The gate wiring GW is embedded into the hole CH2, and is electrically connected to the gate electrode GE. The source electrode SE is embedded into the hole CH1, the hole CH3, and the hole CH4, and is electrically connected to the source region NS, the body region PB, the high concentra-tion diffusion region PR, and the field plate electrode FP.

Next, though not illustrated herein, a protective film made of, for example, a polyimide film is formed on the source electrode SE and the gate wiring GW by, for example, the coating method. Regions to be the source pad SP and the gate pad GP in the source electrode SE and the gate wiring GW are exposed by opening a part of the protective film.

Thereafter, through the following manufacturing steps, the semiconductor device 100 shown in FIG. 4 is manufac-tured. First, the lower surface BS of the semiconductor substrate SUB is polished according to needs. Next, for example, arsenic (As) or the like is introduced into the lower surface BS of the semiconductor substrate SUB by the ion implantation method, so that the n-type drain region ND is formed. Next, the drain electrode DE is formed by the sputtering method under the lower surface BS of the semi-conductor substrate SUB.

Structural Feature of Semiconductor Device

As described with reference to FIG. 8 to FIG. 11, in the first embodiment, the void 20 is not formed in the field plate electrode FP. Therefore, even if the insulating film IF2 is formed, the problem that volume expansion occurs inside the field plate electrode FP and the crystal defects 30 occur in the semiconductor substrate SUB located in the vicinities of the corner portions of the trench TR1 as in the studied example is less likely to occur.

Moreover, the presence of the void 20 causes the problem that the upper portion of the field plate electrode FP is likely to be processed like a protruding portion, an electric field is concentrated at such a protruding portion, and insulation resistance between the field plate electrode FP and the gate electrode GE becomes likely to be degraded. In the first embodiment, such a problem is also suppressed. Hence, according to the first embodiment, the problem of the decrease in the withstand voltage of the MOSFET can be suppressed, and the reliability of the semiconductor device 100 can be enhanced.

Moreover, as described with reference to FIG. 13, the width W2 of the upper portion of the contact portion FPa is larger than the width W1 of the lower portion of the contact portion FPa. This relationship applies also to FIG. 4 showing the final structure.

Moreover, with regard to the insulating film IF1, the thickness T2 of the insulating film IF1 at the position of the upper surface TS of the semiconductor substrate SUB is smaller than the thickness T1 of the insulating film IF1 at half the depth from the upper surface TS of the semiconductor substrate SUB to the deepest portion of the trench TR1 at the stage of FIG. 7. Though the insulating film IF1 is retreated in FIG. 4, a part of the insulating film IF1 inherits and keeps such a relationship. For example, as shown in the B-B cross section of FIG. 4, the thickness of the insulating film IF1 that is in contact with the contact portion FPa is the smallest at the part of the insulating film IF1 which is the closest to the upper surface of the contact portion FPa.

In the first embodiment, since the width W2 of the upper portion of the contact portion FPa is large, a margin for the misalignment at the time of forming the hole CH3 is increased. Namely, it is made easy to position the hole CH3 onto the contact portion FPa.

Second Embodiment

A semiconductor device in a second embodiment will be described below with reference to FIG. 21. Note that, in the following description, differences from the first embodiment will be mainly described, and descriptions of the points that overlap with the first embodiment will be omitted.

In the second embodiment, the ions are implanted into the insulating film IF1 from directions inclined from the normal direction by predetermined angles in the ion implantation process of FIG. 6 as in the first embodiment. Further, in the second embodiment, as shown in FIG. 21, the plurality of ion implantations is respectively performed from the directions inclined from the extending direction of the trench TR1 (the Y-direction) by different angles in plan view. FIG. 21 shows the case where twelve ion implantations IMP1 to IMP12 are respectively performed from the directions inclined by angles different from one another in plan view.

When the ion implantation is performed from the same direction as the extending direction of the trench TR1 (the Y-direction) in plan view, the ions are implanted also into the insulating film IF1 located at the bottom of the trench TR1. As a result, the etching rate of the insulating film IF1 located at the bottom of the trench TR1 increases by the etching treatment (for example, the wet etching treatment) in the next step, and a part where the thickness of the insulating film IF1 is reduced is locally formed. Therefore, there is a fear that the problem of the degradation in an insulating withstand voltage may occur.

Moreover, when the semiconductor device 100 includes the trenches TR2 as termination regions in the outer periphery region OR, such a problem can occur also in the trenches TR2. As shown in FIG. 3, the trenches TR2 are formed so as to surround the cell region CR in plan view and include the part extending in the Y-direction and the part extending in the X-direction.

Hence, the plurality of ion implantations IMP1 to IMP12 in FIG. 21 needs to be respectively performed from the directions other than the Y-direction and the directions other than the X-direction. In other words, the plurality of ion implantations IMP1 to IMP12 is respectively performed from the directions other than the extending direction of the trench TR1 and the directions other than directions inclined from the extending direction of the trench TR1 by angles which are multiples of 90 degrees.

Moreover, as shown in FIG. 3, the trenches TR2 are sometimes provided with corner portions TR2a which couple the parts extending in the Y-direction and the parts extending in the X-direction to each other. The corner portions TR2a extend in the directions inclined by 45 degrees from the Y-direction or the X-direction in plan view. Although it is not essential to provide the corner portions TR2a, the parts extending in the Y-direction and the parts extending in the X-direction are coupled to each other at a right angle if such corner portions TR2a are not provided. As a result, the thickness of the insulating film IF1 is likely to vary and the filling failure of the conductive film CF1 is likely to occur at the right-angle part. Hence, it is preferable that the trenches TR2 are provided with the corner portions TR2a in order to make such failures less likely to occur.

When the corner portions TR2a are provided in the trenches TR2, it is also necessary to prevent the ions from being implanted into the insulating film IF1 located at the bottoms of the corner portions TR2a. Hence, the plurality of ion implantations IMP1 to IMP12 in FIG. 21 needs to be respectively performed from the directions other than the Y-direction, the directions other than the X-direction, and the directions other than the directions inclined from the Y-direction or the X-direction by 45 degrees. In other words, the plurality of ion implantations IMP1 to IMP12 is respectively performed from the directions other than the extending direction of the trench TR1 and the directions other than the directions inclined from the extending direction of the trench TR1 by angles which are multiples of 45 degrees.

A depth of the ion implantations IMP1 to IMP12 in the case in which the plurality of ion implantations IMP1 to IMP12 in the second embodiment is viewed in cross-sectional view will be described. For example, it is assumed that implantation angles of the ion implantations IMP1 to IMP12 in cross-sectional view are respectively the same angle like the implantation angle $\theta 1$ in FIG. 6. In this case, in the ion implantations inclined by 180 degrees to each other such as the ion implantation IMP2 and the ion implantation IMP8, the depths of the ions implanted into the insulating film IF1 become the same depth.

Moreover, for example, the ion implantation IMP1, the ion implantation IMP2, and the ion implantation IMPS are performed at angles different from one another in plan view, and therefore, the depths of these ion implantations become different from one another. In the ion implantation IMP1 in which an inclination angle from the extending direction of the trench TR1 is small, the depth of the ions implanted into the insulating film IF1 becomes the largest. In the ion implantation IMP3 in which an inclination angle from the extending direction of the trench TR1 is close to 90 degrees, the depth of the ions implanted into the insulating film IF1 becomes the smallest. In the ion implantation IMP2, the depth of the ions implanted into the insulating film IF1 becomes the depth between the depth in the ion implantation IMP1 and the depth in the ion implantation IMP3.

As described above, even if the implantation angles in cross-sectional view are the same as $\theta 1$, the depth distribution of the ions implanted into the insulating film IF1 can be controlled by making the implantation angles in plan view different from one another. Other than the plurality of ion implantations IMP1 to IMP12 performed at the implantation angle $\theta 1$ in FIG. 6, the plurality of ion implantations IMP1 to IMP12 may also be performed at a variety of other implantation angles such as the implantation angle $\theta 2$ in FIG. 6. Thereby, the depth distribution of the ions can be controlled more in detail.

Although the second embodiment illustrates the case of performing twelve ion implantations IMP1 to IMP12, the number of times of the ion implantations in the second embodiment is not limited to twelve, and can be set to the necessary number of times as appropriate.

Third Embodiment

A semiconductor device in a third embodiment will be described below with reference to FIG. 22. Note that, in the following description, differences from the first embodiment will be mainly described, and descriptions of the points that overlap with the first embodiment will be omitted.

The case in which the ion implantations are performed to the insulating film IF1 has been described in the first embodiment, but the ion implantations are performed to the conductive film CF1 in the third embodiment.

FIG. 22 shows a state of performing the ion implantations to the conductive film CF1 after the formation of the conductive film CF1 in FIG. 8 and before performing the etching treatment in FIG. 9. Impurities which exhibit an n-type conductivity type are preferable for ion species in this ion implantation, and for example, the ion species are arsenic (As) or phosphorus (P). Namely, the ion species in this ion implantation are preferably impurities of the same conductivity type as the conductivity type of the field plate electrode FP (the conductive film CF1, the conductive film CF2).

The ion implantations to the conductive film CF1 are performed in the same manner as that of the ion implantations to the insulating film IF1. Namely, as shown in FIG. 22, the ion implantation to the conductive film CF1 is also performed from the directions inclined by predetermined angles (the angle θ1, the angle θ2, and the like) from the normal direction with respect to the upper surface TS of the semiconductor substrate SUB like the ion implantation to the insulating film IF1. As the implantation angle becomes larger, it becomes easier to implant the ions into the conductive film CF1 close to the uppermost portion of the trench TR1. By reducing the implantation angle, the ions can be implanted into not only the vicinity of the uppermost portion of the trench TR1 but also the conductive film CF1 located away from the uppermost portion of the trench TR1.

The etching rate of the etching treatment in FIG. 9 is different between the spot where the ions are implanted and the spot where the ions are not implanted. At the spot where the ions are implanted, the etching rate of the etching treatment becomes faster in comparison with the spot where the ions are not implanted. The etching rate becomes faster at such a spot where a larger number of ions are implanted.

Hence, in the third embodiment, after the etching treatment in FIG. 9, the conductive film CF1 located at the uppermost portion of the trench TR1 is thinned as compared with that in the first embodiment. By forming the conductive film CF2 in FIG. 10 in this state, the conductive film CF2 can be satisfactorily embedded into the trench TR1, and the occurrence of the void 20 can be further suppressed.

Moreover, also in the third embodiment, by using the technical idea similar to that in the second embodiment, the plurality of ion implantations can be respectively performed from the directions inclined by different angles from the extending direction of the trench TR1 (the Y-direction) in plan view.

Moreover, as described in the first embodiment, even if each of the ion implantations and the etching treatment in FIG. 6 is not performed to the insulating film IF1, the forming method of the field plate electrode FP described with reference to FIG. 8 to FIG. 11 is effective as a method for suppressing the occurrence of the void 20. This applies also to the third embodiment.

Modification

A semiconductor device in a modification of the third embodiment will be described below with reference to FIG. 23 and FIG. 24. FIG. 23 and FIG. 24 show a state of forming an oxide film on the surface of the conductive film CF1 and removing this oxide film after the ion implantation in FIG. 22 and before performing the etching treatment in FIG. 9.

As shown in FIG. 23, thermal oxidation treatment is performed to the conductive film CF1. By this thermal oxidation treatment, an oxide film OX1 is formed on the surface of the conductive film CF1. At this time, the ion implantation in FIG. 22 has been performed to an upper portion of the conductive film CF1. Namely, a larger amount of n-type impurities are contained in the upper portion of the conductive film CF1 than in the lower portion of the conductive film CF1. When the thermal oxidation treatment is performed in this state, due to the influence of the accelerated oxidation, the progress of oxidation becomes faster in such a part where a larger amount of the impurities are contained. Hence, the oxide film OX1 is formed thicker on the upper portion of the conductive film CF1 than on the lower portion of the conductive film CF1.

Thereafter, as shown in FIG. 24, the oxide film OX1 is removed by the etching treatment. A thickness of the conductive film CF1 thus left is smaller at the upper portion of the trench TR1 than at the lower portion of the trench TR1. For example, wet etching using a solution that contains hydrofluoric acid is used for this etching treatment.

By performing the etching treatment (for example, the dry etching treatment) to the conductive film CF1 in this state, the thickness of the conductive film CF1 located in the vicinity of the upper portion of the trench TR1 can be reduced more than that in FIG. 9. Therefore, the conductive film CF2 can be more satisfactorily embedded into the trench TR1, and the occurrence of the void 20 can be further suppressed.

In the foregoing, the present invention has been specifically described based on the embodiments. However, the present invention is not limited to these embodiments and can be modified in various ways within the range not departing from the gist thereof.

What is claimed is:

1. A method of manufacturing a semiconductor device, the method comprising:

(a) preparing a semiconductor substrate of a first conductivity type, the semiconductor substrate having an upper surface and a lower surface;

(b) forming a first trench in the upper surface of the semiconductor substrate;

(c) forming a first insulating film in the first trench and on the upper surface of the semiconductor substrate;

(d) performing a first ion implantation to the first insulating film;

(e) after the (d), reducing a thickness of the first insulating film by performing an etching treatment to the first insulating film; and (f) after the (e), forming a first conductive film in the first trench via the first insulating film, wherein, in plan view, the first trench extends in a first direction, and wherein, in the (d), the first ion implantation is performed from a direction inclined by a first angle from a normal direction with respect to the upper surface of the semiconductor substrate in cross-sectional view.

2. The method of manufacturing the semiconductor device according to claim 1, wherein, in cross-sectional view, the first trench includes:
a bottom surface; and
a side surface, wherein, in cross-sectional view, the first insulating film includes:
a first portion that is formed on the side surface of the first trench and is located at an opening of the first trench; and a second portion that is formed on the side surface of the first trench and is located closer to the bottom surface of the first trench than the opening of the first trench, wherein a thickness of the first portion is smaller than a thickness of the second portion after the (e), and wherein the thickness of each of the first portion and the second portion is a thickness based on the side surface of the first trench rather than a thickness based on the bottom surface of the first trench.

3. The method of manufacturing the semiconductor device according to claim 1, wherein a second ion implantation is performed after the first ion implantation in the (d), and wherein the second ion implantation is performed from a direction inclined from the normal direction by a second angle different from the first angle in cross-sectional view.

4. The method of manufacturing the semiconductor device according to claim 1, wherein a second ion implantation is performed after the first ion implantation in the (d), wherein the first ion implantation is performed from a direction inclined by a third angle from the first direction in plan view, and wherein the second ion implantation is performed from a direction inclined from the first direction by a fourth angle different from the third angle in plan view.

5. The method of manufacturing the semiconductor device according to claim 4, wherein the semiconductor device includes a cell region in which a plurality of MOSFETs is formed and an outer periphery region that surrounds the cell region in plan view, wherein each of the plurality of MOSFETs includes:
the first trench;
the first insulating film; and
a field plate electrode made of the first conductive film, wherein, in the (b), a second trench is formed in the upper surface of the semiconductor substrate located in the outer periphery region, wherein the second trench extends in the first direction and a second direction perpendicular to the first direction in plan view so as to surround the cell region in plan view, and wherein each of the first ion implantation and the second ion implantation is performed from directions, in plan view, from a direction other than the first direction and other than a direction inclined from the first direction by an angle that is a multiple of 90 degrees.

6. The method of manufacturing the semiconductor device according to claim 5, wherein the second trench has a corner portion that couples a part extending in the first direction and a part extending in the second direction to each other, wherein the corner portion extends in a direction inclined by an angle of 45 degrees from the first direction or the second direction in plan view, and wherein each of the first ion implantation and the second ion implantation is performed from the directions other than the first direction and directions other than directions inclined from the first direction by angles which are multiples of 45 degrees in plan view.

7. The method of manufacturing the semiconductor device according to claim 1, wherein the (f) includes:
(f1) after the (e), forming the first conductive film on the first insulating film;

(f2) after the (f1), reducing a thickness of the first conductive film by performing an etching treatment to the first insulating film; and (f3) after the (f2), forming a second conductive film in the first trench via the first insulating film and the first conductive film, so as to fill the first trench.

8. The method of manufacturing the semiconductor device according to claim 7, wherein the (f) further includes:
(f4) between the (f1) and the (f2), performing an ion implantation to the first conductive film from a direction inclined by a fifth angle from the normal direction with respect to the upper surface of the semiconductor substrate.

9. The method of manufacturing the semiconductor device according to claim 8, wherein the (f) further includes:
(f5) between the (f4) and the (f2), forming an oxide film on a surface of the first conductive film by thermal oxidation treatment; and (f6) between the (f5) and the (f2), removing the oxide film by the etching treatment.

10. The method of manufacturing the semiconductor device according to claim 7, further comprising:

(g) after the (f), selectively retreating portions of a field plate electrode composed of the first conductive film and the second conductive film formed in the first trench after the (f3) such that a part of the field plate electrode is left as a contact portion;

(h) after the (g), retreating the first insulating film such that a position of an upper surface of the first insulating film is lower than a position of an upper surface of the field plate electrode in the first trench;

(i) after the (h), forming a gate insulating film in the first trench on the first insulating film, and forming a second insulating film on the upper surface and a side surface of the field plate electrode exposed from the first insulating film; and (j) after the (i), forming a gate electrode on the field plate electrode retreated in the (g) so as to fill the first trench.

11. The method of manufacturing the semiconductor device according to claim 10, wherein, after the (g), a width of the contact portion at a position of the upper surface of the semiconductor substrate is larger than a width of the contact portion at half a depth from the upper surface of the semiconductor substrate to a deepest portion of the first trench in cross-sectional view.

12. The method of manufacturing the semiconductor device according to claim 10, further comprising:

(k) after the (j), forming a body region of a second conductivity type opposite to the first conductivity type in the semiconductor substrate so as to be shallower than the first trench in cross-sectional view;

(l) after the (k), forming a source region of the first conductivity type in the body region;

(m) after the (l), forming an interlayer insulating film on the upper surface of the semiconductor substrate so as to cover the first trench;

(n) after the (m), forming, in the interlayer insulating film, a first hole that reaches the source region and the body region, a second hole that reaches the gate electrode, and a third hole that reaches the contact portion;

(o) after the (n), forming a source electrode and a gate wiring that surrounds the source electrode in plan view on the interlayer insulating film; and (p) after the (o), forming a drain electrode under the lower surface of the semiconductor substrate, wherein the gate wiring is embedded in the second hole and is electrically connected to the gate electrode, and wherein the source electrode is embedded in the first hole and the third hole and is electrically connected to the source region, the body region, and the field plate electrode.

13. The method of manufacturing the semiconductor device according to claim 1, wherein the (c) includes:

(c1) forming a first silicon oxide film in the first trench and on the upper surface of the semiconductor substrate by a thermal oxidation method; and (c2) forming a second silicon oxide film on the first silicon oxide film by a CVD method, and wherein the first insulating film includes the first silicon oxide film and the second silicon oxide film.

14. The method of manufacturing the semiconductor device according to claim 13, wherein, in the (c1), the first silicon oxide film is formed such that a thickness of the first silicon oxide film is smaller than a thickness of the second silicon oxide film.

* * * * *